US007049229B2

(12) United States Patent
Omote et al.

(10) Patent No.: US 7,049,229 B2

(45) Date of Patent: May 23, 2006

(54) METHOD OF FABRICATING SEMICONDUCTOR DEVICE AND SEMICONDUCTOR DEVICE

(75) Inventors: Koji Omote, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 171 days.

(21) Appl. No.: 10/852,134

(22) Filed: May 25, 2004

(65) Prior Publication Data

US 2005/0026335 A1 Feb. 3, 2005

(30) Foreign Application Priority Data

Jul. 31, 2003 (JP) ............................ 2003-284368
Jan. 21, 2004 (JP) ............................ 2004-013653

(51) Int. Cl.
*H01L 21/44* (2006.01)

(52) U.S. Cl. ...................... 438/667; 438/109; 257/774; 257/775

(58) Field of Classification Search .................. 117/97, 117/250; 148/33.2; 257/524, 773, 774, 257/775; 438/109, 110, 458, 667
See application file for complete search history.

(56) References Cited

U.S. PATENT DOCUMENTS 5,496,755 A * 3/1996 Bayraktaroglu ............. 438/167
5,903,058 A * 5/1999 Akram ....................... 257/778
6,110,825 A * 8/2000 Mastromatteo et al. ..... 438/667
6,225,651 B1 * 5/2001 Billon ........................ 257/200
6,294,837 B1 * 9/2001 Akram et al. ............... 257/774
6,303,469 B1 * 10/2001 Larson et al. ............... 438/459
6,319,751 B1 * 11/2001 Lin ............................ 438/108
6,624,500 B1 * 9/2003 Takafuji ..................... 257/532
6,627,824 B1 * 9/2003 Lin ............................ 174/268
6,716,657 B1 * 4/2004 Soh ............................. 438/29
6,841,883 B1 * 1/2005 Farnworth et al. .......... 257/777

FOREIGN PATENT DOCUMENTS

JP 62-072161 4/1987
JP 05-029483 2/1993
JP 2003-078080 3/2003

* cited by examiner

*Primary Examiner*—George Fourson
*Assistant Examiner*—Fernando L. Toledo
(74) *Attorney, Agent, or Firm*—Westerman, Hattori, Daniels & Adrian, LLP

(57) ABSTRACT

An insulating film having openings larger than viaholes, formed as being aligned with the viaholes, is coated on the back surface of a silicon semiconductor substrate so that the viaholes fall within the openings, a conductive film is then formed so as to fill the viaholes and the openings by plating, vacuum evaporation or a technique using a metal paste, and the conductive film is then cut using a bite to thereby form through electrodes.

36 Claims, 26 Drawing Sheets

11 12 C 9 8a 2a 8 5 4 1 72 20 71 21 22 21a 5a 2a
12 2a 8a 9 8 5 1 4 5a 71 72 22 2b 21 21a 1
40
20
41a
71
5a
C
41a
8a
9
42
5
4
42
44
45
43
5
1
71
40
41
9
45a
41a
45a
5a
42a
9
5
1
4
42

1
40
20
41a
71
10
5a
C
41a
42a
9
42
5
4
42
9
5
1
71
40
41
10
41a
42a
5a
9
5
1
4
42

METHOD OF FABRICATING SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application Nos. 2004-013653, filed on Jan. 21, 2004 and 2003-284368, filed on Jul. 31, 2003, the entire contents of which are incorporated herein by reference.

BACKGROUND OF THE INVENTION

1. Field of the Invention

The present invention relates to a semiconductor device having a through electrode which pierces a semiconductor substrate, a method of fabricating the same, and further relates to a composite semiconductor device having a plurality of semiconductor devices stacked and integrated therein.

2. Description of the Related Art

In recent years, there are developed composite semiconductor device having a plurality of LSI chips staked and integrated therein. Fabrication of the composite semiconductor device needs formation of a connection electrode so as to pierce the LSI chip. One possible method of the formation is such as forming an opening (through-hole), which reaches an LSI electrode, by etching the semiconductor substrate (wafer) from the back surface thereof by RIE, insulating the back surface of the wafer and inside of the opening at the same time typically by a technique such as the CVD process, and selectively removing the insulating film in a portion corresponded to the electrode at the bottom of the opening. A barrier metal layer such as TaN and TiN is formed in the opening, a film-formed resist is placed on the back surface of the wafer, the resist is removed selectively on the opening by photolithography, and a metal is filled in the opening by the plating process using the barrier metal as a seed.

Another approach ever made is such as forming a deep viahole by RIE or laser processing from the surface of an LSI chip, insulating the inner surface of the viahole, filling a metal typically by plating, grinding and dry-etching the metal from the back surface of the wafer so as to expose the metal at the end of the viahole, to thereby make it as a connection electrode.

[Patent Document 1] Japanese Patent Application Laid-Open No. 2003-78080

[Patent Document 2] Japanese Patent Application Laid-Open No. 62-72161

[Patent Document 3] Japanese Patent Application Laid-Open No. 5-29483

SUMMARY OF THE INVENTION

It is an object of the present invention to provide a highly-reliable semiconductor device having a through electrode capable of ensuring sufficient insulation from a substrate and mechanical strength; a method of fabricating a semiconductor device capable of forming the through electrode in a simple and exact manner; and a composite semiconductor device having a plurality of semiconductor devices stacked and integrated therein.

It is another object of the present invention to provide a highly-reliable semiconductor device having a first electronic circuit on a first main surface (top surface, or example) of a semiconductor wafer, and having a film having a second electronic circuit buried therein on a second main surface (back surface, for example), and capable of ensuring sufficient insulation from a substrate and mechanical strength; and a method of fabricating a semiconductor device capable of connecting the first and second electronic circuits by a simplified process, where a conventional process necessarily includes CMP of the back surface of the semiconductor substrate and photolithographic wiring formation process.

It is still another object of the present invention to provide a semiconductor device capable of ensuring an advanced reliability, in which stress possibly generated in the process of stacking and integrating the semiconductor devices having the through electrode is successfully reduced, by reducing variation in height of the laterally arranged individual through electrodes to a considerable degree, and at the same time by planarizing the surface of the through electrode and the surface of an insulating film burying the through electrode while keeping a continuity of the both.

A method of the present invention is a method of fabricating a semiconductor device having a semiconductor element formed on one main surface of a semiconductor substrate, which comprises the steps of forming a first opening in the substrate from the opposite main surface thereof, so as to expose therein a contact portion of the semiconductor element; forming a first insulating film on the opposite main surface of the semiconductor substrate so as to cover also the inner wall surface of the first opening; removing a portion of the first insulating film locally at the bottom of the first opening so as to expose a part of the contact portion; aligning and placing a film-formed second insulating film, having a second opening larger than the first opening, on the opposite main surface of the semiconductor substrate so as to allow the first opening to fall within the second opening; forming a conductive film on the second insulating film so as to fill both of the first and second openings; and removing a part of the conductive film and the second insulating film to thereby form a through electrode which fills the first and second openings and is connected to the contact portion.

In the formation of the through electrode in the above-described case, it is preferable to cut the conductive film and the second insulating film so as to planarize their surfaces while keeping a continuity of the both.

Another method of the present invention is a method of fabricating a semiconductor device having a first electronic circuit formed on one main surface of a semiconductor substrate, which comprises the steps of forming a first opening in the substrate from the opposite main surface thereof, so as to expose therein a first contact portion of the first electronic circuit; forming an insulating film on the opposite main surface of the semiconductor substrate so as to cover also the inner wall surface of the first opening; removing a portion of the first insulating film locally at the bottom of the first opening so as to expose a part of the first contact portion; aligning and placing a film, the film having a second opening larger than the first opening, having a second electronic circuit formed as being buried therein, and having a second contact portion of the second electronic circuit as being exposed to the inner wall surface of the second opening, on the opposite main surface of the semiconductor substrate so as to allow the first opening to fall within the second opening; filling a conductive material at least into the first and second openings to thereby form a conductive film electrically connected to the first and second contact portions; and removing a part of the conductive film and the film to thereby form a through electrode which is connected to each of the first and second contact portions.

It is preferable in this case that the film has a third opening in which a third contact portion of the second electronic circuit is exposed, in adjacent to the second opening; and the conductive film is formed so as to bury the third opening together with the first and second openings, to thereby form an electrode electrically connected to the third contact portion, together with the through electrode.

In the formation of the through electrode in this case, it is preferable to cut the conductive film and the film, to thereby planarize the surface of the conductive film and the surface of the film while keeping a continuity of the both.

A semiconductor device of the present invention is such as comprising a semiconductor substrate having a semiconductor element formed on one main surface thereof; a first opening formed from the opposite surface of the semiconductor substrate, so as to expose therein a contact portion of the semiconductor element; a first insulating film formed on the opposite surface of the semiconductor substrate so as to cover also the inner wall surface of the first opening, and so as to expose a part of the contact portion out from a part of the bottom of the first opening; a film-formed second insulating film having a thickness larger than the first insulating film, having a second opening larger than the first opening, and coated on the opposite surface of the semiconductor substrate so as to allow the first opening to fall within the second opening; and a through electrode connected to the contact portion through filling of the first and second openings; where the surface of the through electrode and the surface of the second insulating film are planarized while keeping a continuity of the both.

Another semiconductor device of the present invention is such as comprising a semiconductor substrate having a first electronic circuit formed on one main surface thereof; a first opening formed from the opposite surface of the semiconductor substrate, so as to expose therein a first contact portion of the first electronic circuit; an insulating film formed on the opposite surface of the semiconductor substrate so as to cover also the inner wall surface of the first opening, and so as to expose a part of the first contact portion out from a part of the bottom of the first opening; a film having a second opening larger than the first opening, having a second electronic circuit formed as being buried therein, and having a second contact portion of the second electronic circuit as being exposed to the inner wall surface of the second opening, the film being placed on the opposite main surface of the semiconductor substrate so as to allow the first opening to fall within the second opening; and a through electrode connected to the first and second contact portions through filling of the first and second openings; where the surface of the through electrode and the surface of the film are planarized while keeping a continuity of the both.

It is preferable in this case that the film has a third opening in which a third contact portion of the second electronic circuit is exposed, in adjacent to the second opening; further include an electrode electrically connected to the third contact portion through filling of the third opening; where the surface of the through electrode, the surface of the electrode, and the surface of the film are planarized while keeping a continuity of these.

A composite semiconductor device of the present invention is such as comprising at least two semiconductor devices, wherein in every pair of semiconductor devices brought in focus, the through electrode of one semiconductor and a protruded electrode of the other semiconductor device are connected, stacked and integrated with each other.

DETAILED DESCRIPTION OF THE PREFERRED EMBODIMENTS

Figure 1A:
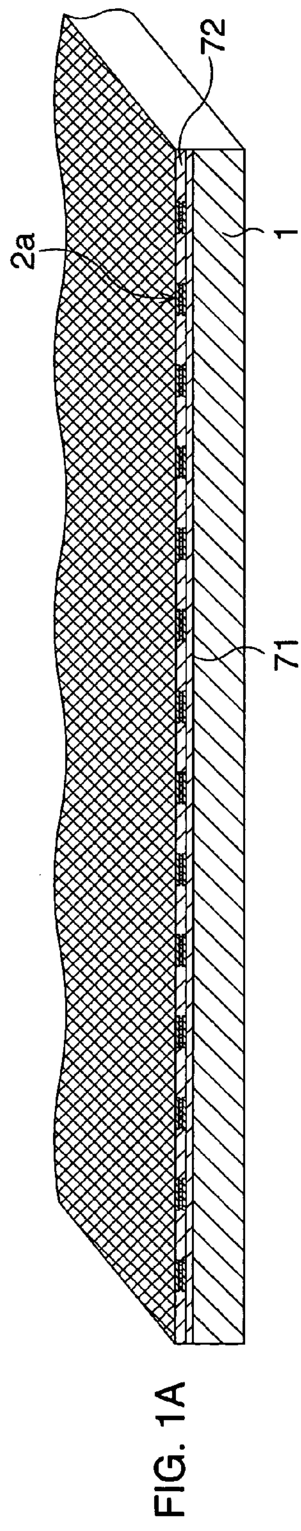
FIGS. 1A to 1D are schematic sectional views sequentially showing process steps of a method of fabricating a semiconductor device according to a first embodiment.

In the formation of the through electrode in the above-described conventional method, it is necessary, after filling of a conductive material for composing the connection electrode into the opening, to carry out mirror processing of the surface of the connection electrode by the chemical-mechanical polishing (CMP) process. It is also essential in the conventional method to place the film-formed resist on the back surface of the wafer, and to process the resist by photolithography. Because the wafer after removal of the resist has an insulating film of $SiO_2$, SiN or the like having a thickness of as small as 1 μm or less exposed on the surface, it is necessary to form a new covering film on the back surface of the wafer and around the through electrode formed in a protruded form, in order to reinforce such thin insulating film. Another problem arises for the case where the through electrode is formed by plating, in that the through electrode is formed as being recessed at the center portion, and causes variation in height of electrode over the entire surface of the wafer. In particular, a recent proposal made on the semiconductor device having through electrode is such as realizing external connection of electronic circuits formed on the surface of the wafer through the through electrode. To realize an exact external connection, there is a strong expectation to a new idea of a highly-reliable semiconductor device and a method of fabricating the same.

Basic Concept of the Present Invention

In view of ensuring sufficient insulating property and mechanical strength of the through electrode formed in the wafer, the present inventors conceived to form the through electrode as being filled in an insulating film and as being planarized on the wafer.

In this case, in order to secure insulation with the surface of the wafer including the inner wall surface of the first opening formed so as to extend from the back surface of the wafer to the contact portion of the semiconductor device, and in order to attain contact with a contact portion only at the bottom of the first opening, it is necessary to form a first insulating film (having an opening only at the contact portion) on the surface before the through electrode is formed. It is necessary to form the first insulating film to an appropriately small thickness (1 μm or les), because the first insulating film covers the inner wall surface of the first opening, and must be removed selectively at the bottom of the opening. This makes it difficult to secure sufficient mechanical strength and sufficient insulation of the back surface of the semiconductor device when the through electrode is filled.

The present invention solves this problem by forming the second insulating film in order to secure sufficient resistance to mechanical impact possibly caused by the through electrode and sufficient insulation. The second insulating film is such as having the second opening larger than the first opening, where the second opening is formed as being aligned with the site of formation of the first opening. The second insulating film is placed on the back surface of the semiconductor substrate so as to allow the first opening to fall within the second opening. In this state, the conductive film is formed so as to fill the first and second openings by plating, vacuum evaporation or a technique using a metal paste.

The conductive film, first insulating film and second insulating film are then cut by machining, and more preferably by cutting using a cutting tool such as bite, to thereby planarize the surface of the conductive film and the surface of the second insulating film while keeping a continuity of the both. This is successful in forming the through electrode having a large resistance against mechanical impact, as being covered with the first insulating film in the first opening, covered with the first insulating film and further surrounded by the thick second insulating film on the back surface of the wafer, and as filling the first and second openings. Adoption of cutting process in particular herein allows high-speed, high-precision planarization and mirror processing, and is successful in forming a plurality of through electrodes in a simple and exact manner without causing variation in the thickness.

The present invention is applicable to the semiconductor device having a first electronic circuit on a first main surface (top surface, or example) of a semiconductor wafer, and having a film having a second electronic circuit buried therein on a second main surface (back surface, for example). The film has the second opening larger than the first opening, and has the second contact portion of the second electronic circuit as being exposed to the inner wall surface of the second opening, and is placed on the back surface of the semiconductor substrate so as to allow the first opening to fall within the second opening, similarly to as described in the above. In this state, the conductive film is formed so as to fill the first and second openings by plating, vacuum evaporation or a technique using a metal paste.

The conductive film, first insulating film and film are then cut by machining, and more preferably by cutting using a cutting tool such as bite, to thereby planarize the surface of the conductive film and the surface of the film while keeping a continuity of the both. This is successful in forming the through electrode having a large resistance against mechanical impact, as being covered with the first insulating film in the first opening, covered with the first insulating film and further surrounded by the thick second insulating film on the back surface of the wafer, and as filling the first and second openings so as to be electrically connected to the first contact portion of the first electronic circuit and the second contact portion of the second electronic circuit. Adoption of cutting process in particular herein allows high-speed, high-precision planarization and mirror processing, and is successful in forming a plurality of through electrodes in a simple and exact manner without causing variation in the thickness, and without needing mirror processing by CMP nor photolithographic wiring formation for making contact between the through electrode and the second electronic circuit. Further in this case, the first electronic circuit and the second electronic circuit can be formed independently. This makes it possible to proceed with parallel operation, to shorten the production time, to improve the yield ratio, and to allow a larger variation in circuit combination.

SPECIFIC EMBODIMENTS OF THE PRESENT INVENTION

First Embodiment

In this embodiment, a specific example of the semiconductor device having a through electrode will be described together with a method of fabricating the same.

Figure 8:
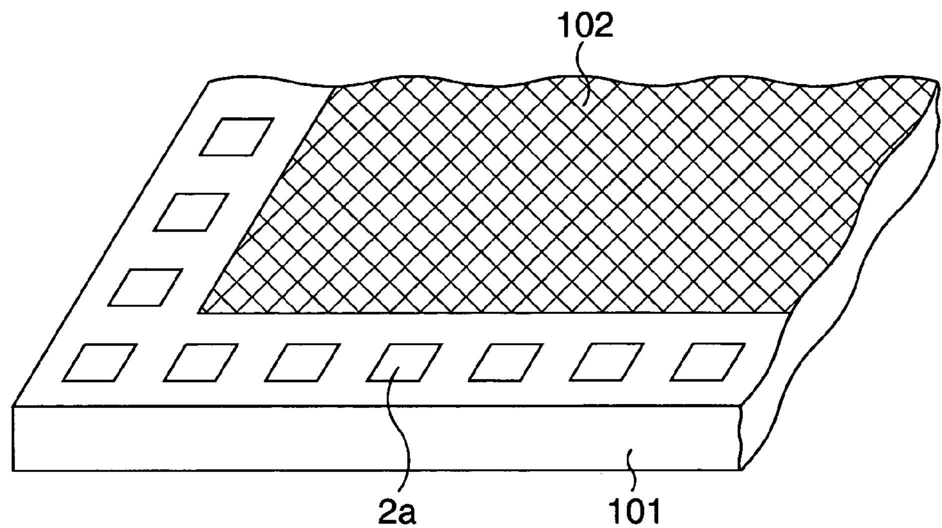
FIG. 8 is a schematic perspective view showing an overall appearance of a semiconductor device applied with the present invention.
Figure 9:
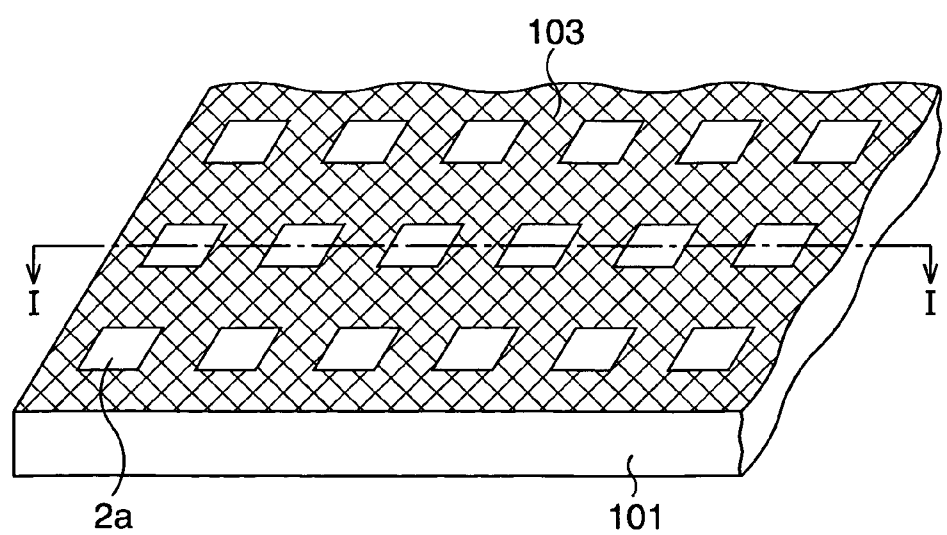
FIG. 9 is a schematic perspective view showing an overall appearance of a semiconductor device applied with the present invention, and disclosed in the embodiment.

The semiconductor devices of this embodiment include those shown in FIG. 8 and FIG. 9.

The semiconductor device shown in FIG. 8 is configured so that, on a silicon semiconductor substrate 101, terminal portions 2*a* are formed so as to surround an element-forming area 102 in which a plurality (a large number) of semiconductor elements (MOS transistors, etc.) are formed, where the terminal portions 2*a* and the individual semiconductor elements are electrically connected. On the other hand, a semiconductor device shown in FIG. 9 is configured so that, on the silicon semiconductor substrate 101, a plurality of terminal portions 2*a* are formed in a matrix pattern, and a plurality (a large number) of semiconductor elements are formed in the area surrounding the individual terminal portions 2*a*. More specifically for the case shown in FIG. 9, the area which falls between every adjacent terminal portions 2*a* forms an element-forming area 103. Although the present invention is applicable to any of the semiconductor devices shown in FIG. 8 and FIG. 9, the following description deals with the semiconductor device shown in FIG. 9 for the convenience sake, and schematic sectional views taken along dotted line I—I shown in FIG. 9 will be shown in FIG. 1A and thereafter.

FIGS. 1A to 5 are schematic sectional views sequentially showing process steps of a method of fabricating a semiconductor device according to the first embodiment. It is to be noted that, in the individual drawings from FIGS. 2A to 5, a portion surrounded by a circle C in the upper illustration (corresponded to the circumferential area of one terminal portion 2*a*) is given as an enlarged view in the lower illustration.

First as shown in FIG. 1A, a silicon semiconductor substrate 1 is obtained. An impurity-diffused region 71 in which impurity-diffused layers of the individual semiconductor elements are formed is formed in the surficial portion of the substrate, and further thereon, the terminal portions 2*a* are formed as being buried in an insulating film 72 typically composed of an inorganic material, while exposing their top surfaces. In this illustrated example, an area which falls between every adjacent terminal portions 2*a* serves as the element-forming area 103. The element-forming area 103 is an area in which LSI elements, typified by semiconductor elements such as MOS transistor, and passive elements such as capacitor and inductor, are formed. Each terminal portion 2*a* comprises two patterned conductors connected through a viahole. The element-forming area 103 in this case can thus be referred to as an entire area not occupied by the terminal portions 2*a*.

Figure 10A:
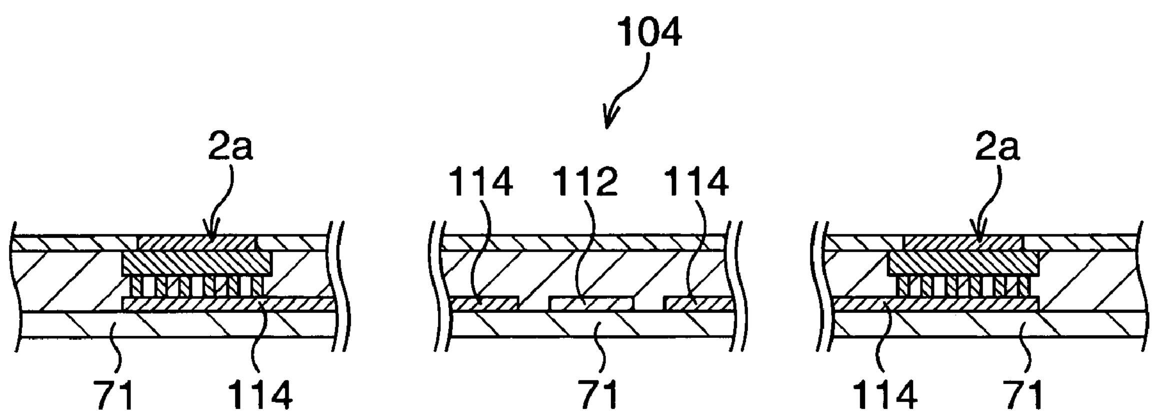
FIGS. 10A and 10B are schematic sectional views showing a state of formation of a MOS transistor in a device-forming area.
Figure 10B:
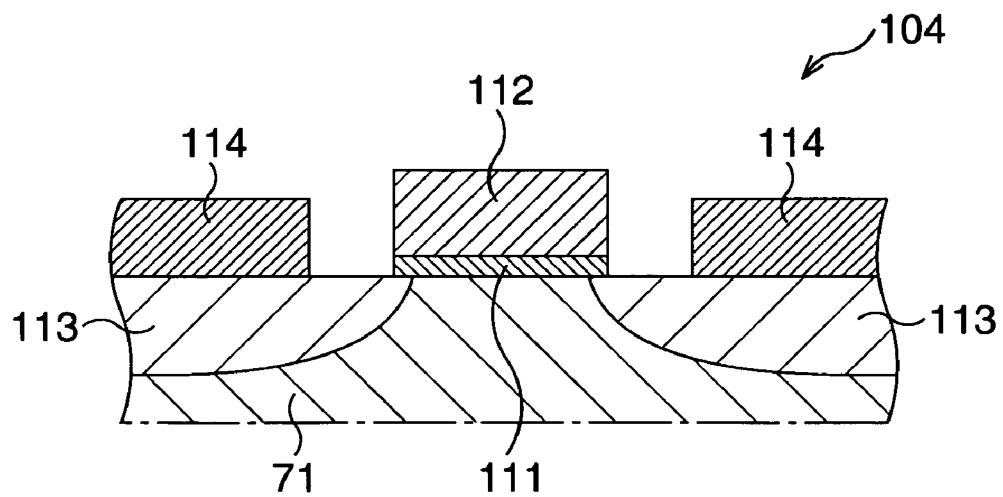

The individual semiconductor elements are not illustrated in FIG. 1A for the convenient sake. More exactly, as shown in FIG. 10A, a plurality (a large number) of semiconductor elements, which are MOS transistors 104 herein, are formed in the element-forming area 103. Each MOS transistor 104 is configured so that a gate electrode 112 is patterned on a gate insulating film 111 formed on the surface of the element-forming area 103, and a pair of impurity-diffused layers 113, which serves as source and drain regions, are formed by doping an impurity into the impurity-diffused region 71 on both sides of the gate electrode 112. On the surface of the element-forming area 103, wirings 114, which compose a part of the terminal portions 2*a*, are patterned so as to contact with the individual impurity-diffused layers 113. The impurity-diffused region 71 is a region in which a large number of impurity-diffused layers of a large number of MOS transistors are formed, but is herein illustrated only as a single impurity-diffused region en bloc for the convenience sake, although the actual configuration has sites having the impurity-diffused layer formed therein and sites having no impurity-diffused layer formed therein.

Illustration of the MOS transistors in FIG. 1A and succeeding drawings is also omitted, because the transistor are formed in a vast number only in a single site between one pair of the adjacent terminal portions 2*a*.

Figure 1B:
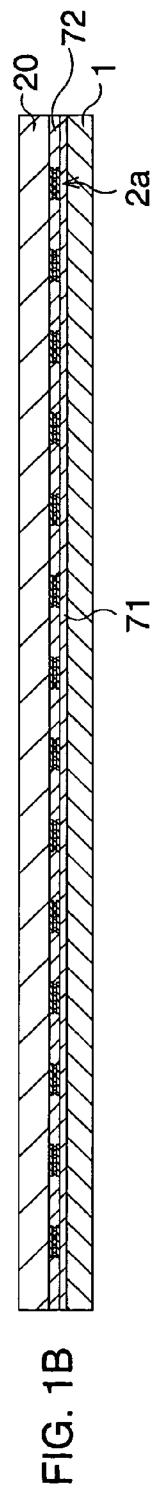

Next, as shown in FIG. 1B, the surface of the silicon semiconductor substrate 1 is attached to a glass base 20 using a UV tape or the like, and the silicon semiconductor substrate 1 is then thinned to as thin as approximately 50 μm to 200 μm by grinding or etching the back surface of the silicon semiconductor substrate 1. For the case where the initial thickness of the silicon semiconductor substrate 1 is not uniform, or the non-uniformity is further accompanied by some waviness, it is preferable to obtain a substrate support (not shown) having a flat supporting surface, onto which the silicon semiconductor substrate 1 is fixed by adsorption, and more specifically by allowing the surface of the silicon semiconductor substrate 1 to be adsorbed by vacuum adsorption, for example. By this procedure; the surface of the silicon semiconductor substrate 1 is forcedly flattened by the adsorption onto the supporting surface, and the flattened surface gives a reference plane for planarization of the back surface. As described in the above, thickness of the silicon semiconductor substrate 1 can be adjusted also by mechanically grinding the back surface while assuming the surface of the substrate as a reference plane for the planarization of the back surface, to thereby remove any convex portions on the back surface by grinding, and to accomplish planarization.

Figure 1C:
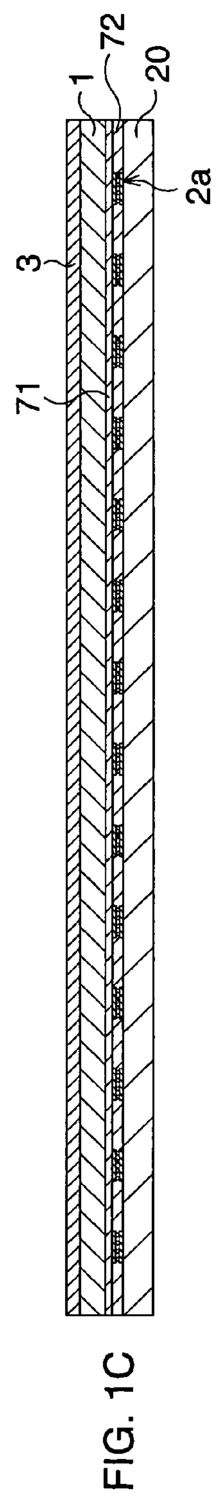

Next, as shown in FIG. 1C, a photoresist 3 is coated on the back surface of the silicon semiconductor substrate 1.

Figure 1D:
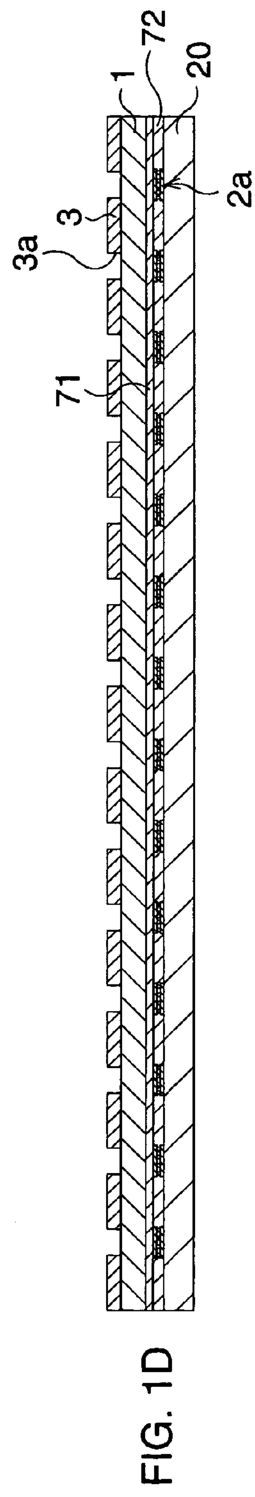

Next, as shown in FIG. 1D, the photoresist 3 is processed by photolithography to thereby form openings 3*a* at projected sites of the individual terminal portions 2*a*.

Figure 2A:
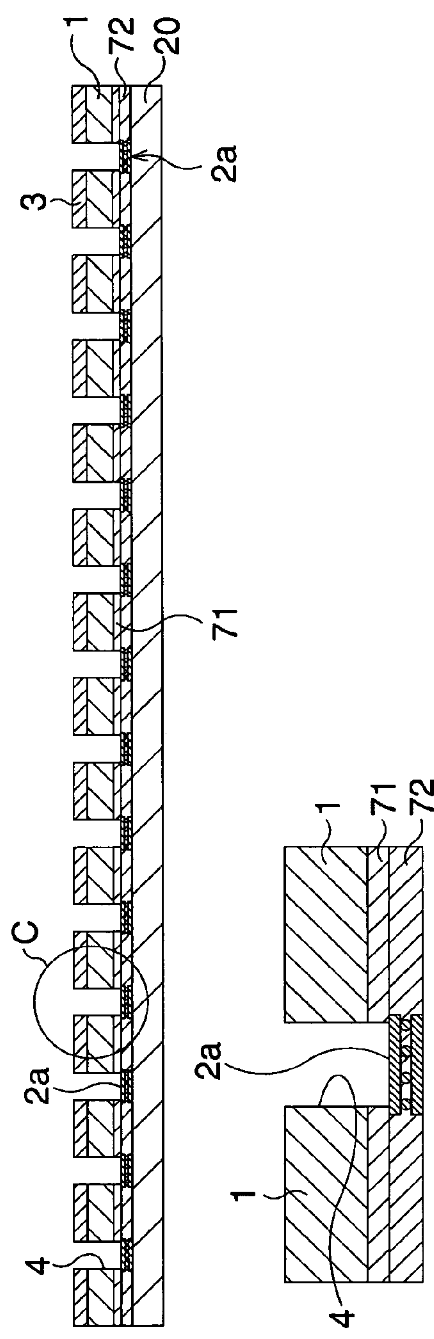
FIGS. 2A and 2B are schematic sectional views sequentially showing process steps of a method of fabricating a semiconductor device according to a first embodiment, as continued from FIG. 1D.

Next, as shown in FIG. 2A, the silicon semiconductor substrate 1, under masking by the photoresist 3, is etched from the back surface, typically by dry etching using a fluorine-base or chlorine base gas, to thereby form viaholes 4 in which a part of the individual terminal portions 2*a* is exposed.

Figure 2B:
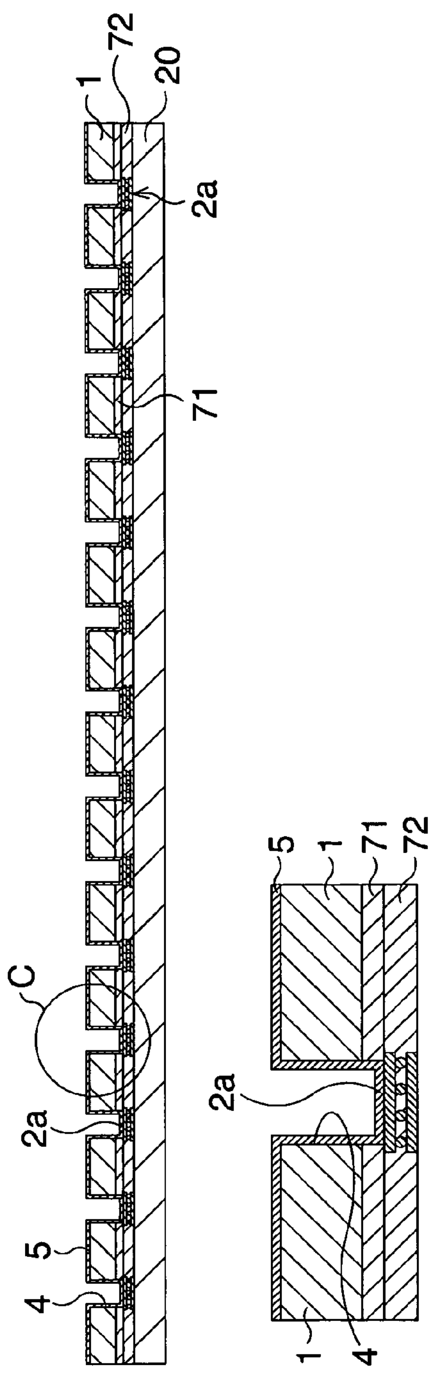

Next, the photoresist 3 is removed typically by ashing. More specifically, the ashing process herein is proceeded so that the photoresist 3 is immersed in an alkaline solution, and is then irradiated with oxygen plasma to thereby remove the residue by ashing. Next, as shown in FIG. 2B, an insulating film 5, which is typically composed of $SiO_2$ or SiN, is formed to a thickness of 1 μm or around typically by the CVD process, on the back surface of the silicon semiconductor substrate 1 so as to cover the inner wall surface of the viaholes 4.

Figure 3A:
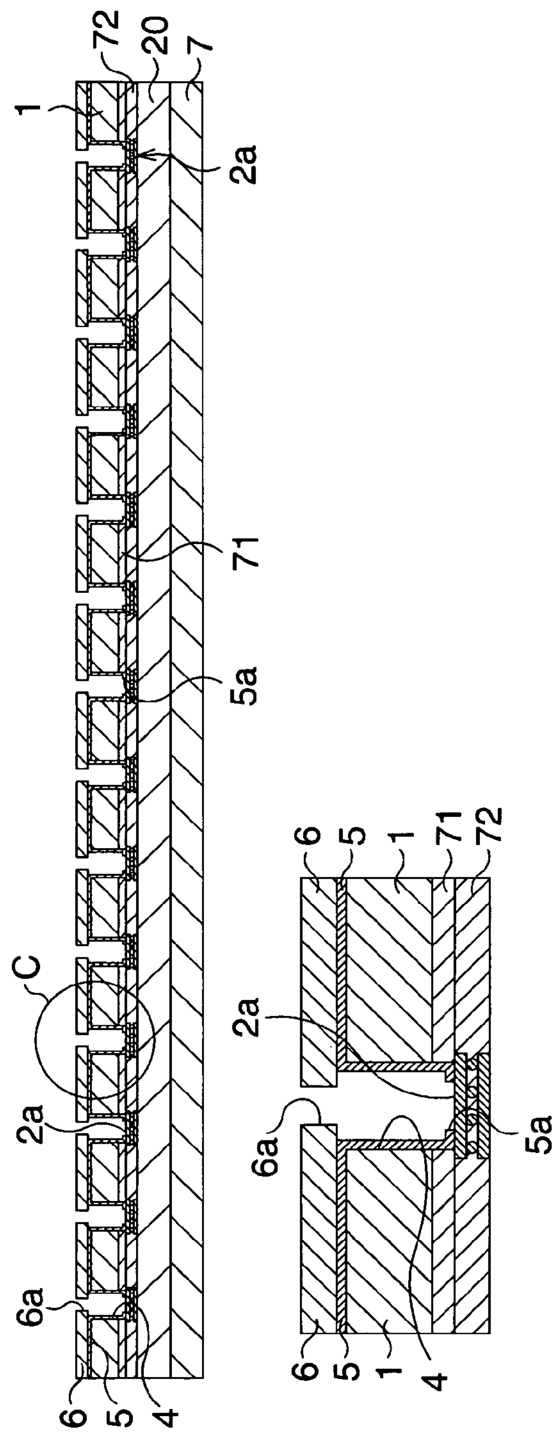
FIGS. 3A and 3B are schematic sectional views sequentially showing process steps of the method of fabricating a semiconductor device according to the first embodiment, as continued from FIG. 2B.

Next, as shown in FIG. 3A, a metal mask 6 is placed on the insulating film 5. The metal mask 6 has, formed therein, openings 6*a* having a diameter smaller than that of the viaholes 4, as being aligned with position of formation of the viaholes 4, and is stacked on the insulating film 5 based on alignment on the back surface of the silicon semiconductor substrate 1 so as to allow each opening 6*a* to fall within each viahole 4 (that is, the outer circumference of the opening 6*a* comes inside the outer circumference of the viahole 4). Position of the metal mask 6 is then fixed with the aid of magnetic force given by a magnet 7 disposed under the base 20.

The insulating film 5 is then dry-etched under masking by the metal mask 6. By the etching, a portion 5*a* of the insulating film 5 at the bottom of each viahole 4 and in a projected site of the opening 6*a* is removed, and thereby a part of the surface of the terminal portion 2*a* exposes.

Figure 3B:
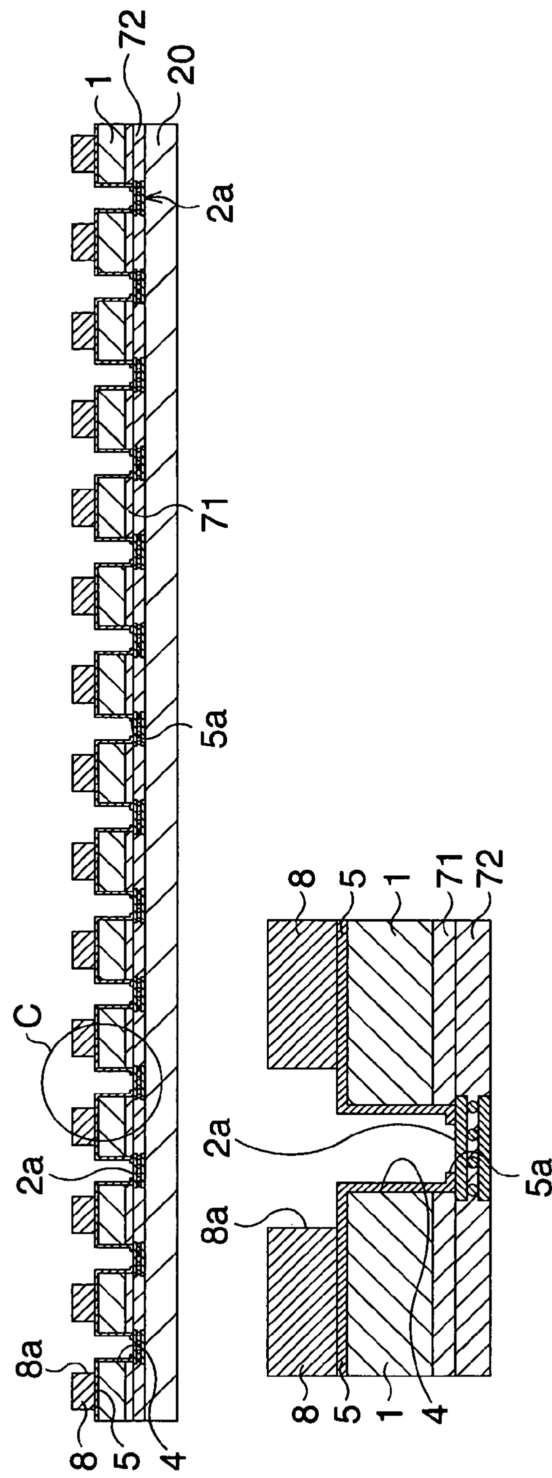

The metal mask 6 is then removed, and as shown in FIG. 3B, a cuttable organic insulating material having a thickness larger than that of the insulating film 5, which is typically an insulating film 8 composed of polyimide, for example, and having a thickness of 30 μm or around, is placed. The insulating film 8 has formed therein openings 8*a* having a diameter larger than that of the viahole 4 as being aligned with the viahole 4, and is placed on the insulating film 5 using a glue based on alignment on the back surface of the silicon semiconductor substrate 1 so as to allow each viahole 4 to fall within each opening 8*a*. Heat-resistant temperatures of the insulating film 8 and the glue are set higher than a maximum temperature possibly reached during the formation process of the through electrode described later.

Figure 6:
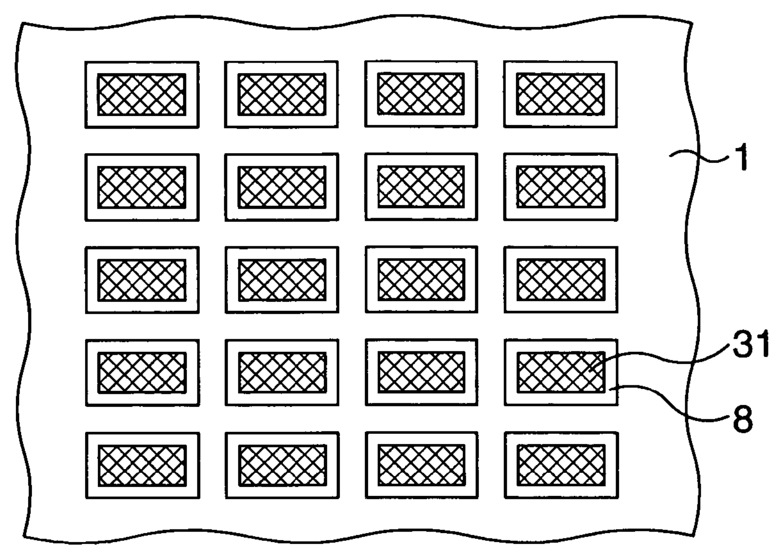
FIG. 6 is a schematic plan view showing a specific example of placement of insulating films on a silicon semiconductor substrate.
Figure 7:
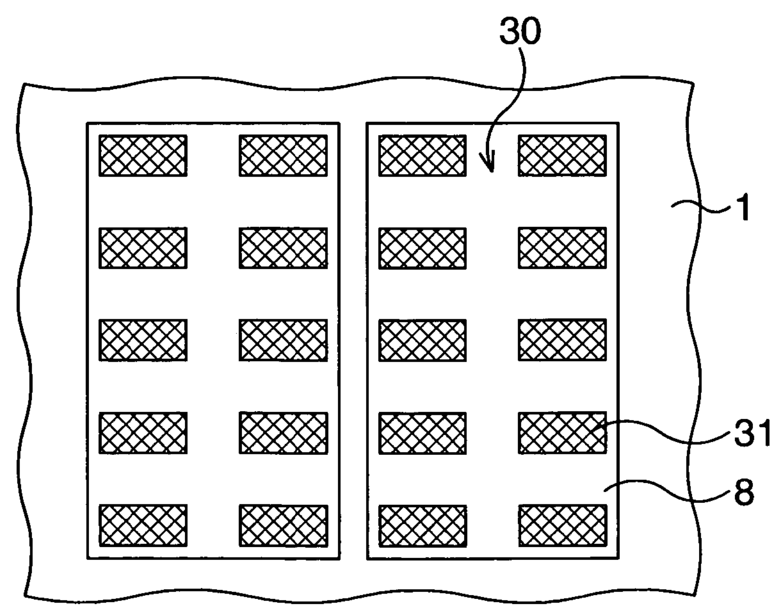
FIG. 7 is a schematic plan view showing another specific example of placement of insulating films on a silicon semiconductor substrate.

Specific methods of placing the insulating film 8 include a method shown in FIG. 6 in which the insulating film 8 is sized corresponding to an LSI element 31, and placed as being aligned with each LSI element 31, and a method shown in FIG. 7 in which the insulating film 8 is sized corresponding to a block 30 consisting of a plurality of the LSI elements 31, and is placed as being aligned with each block 30. It is to be noted that the present embodiment mainly exemplifies the case shown in FIG. 7.

Figure 4A:
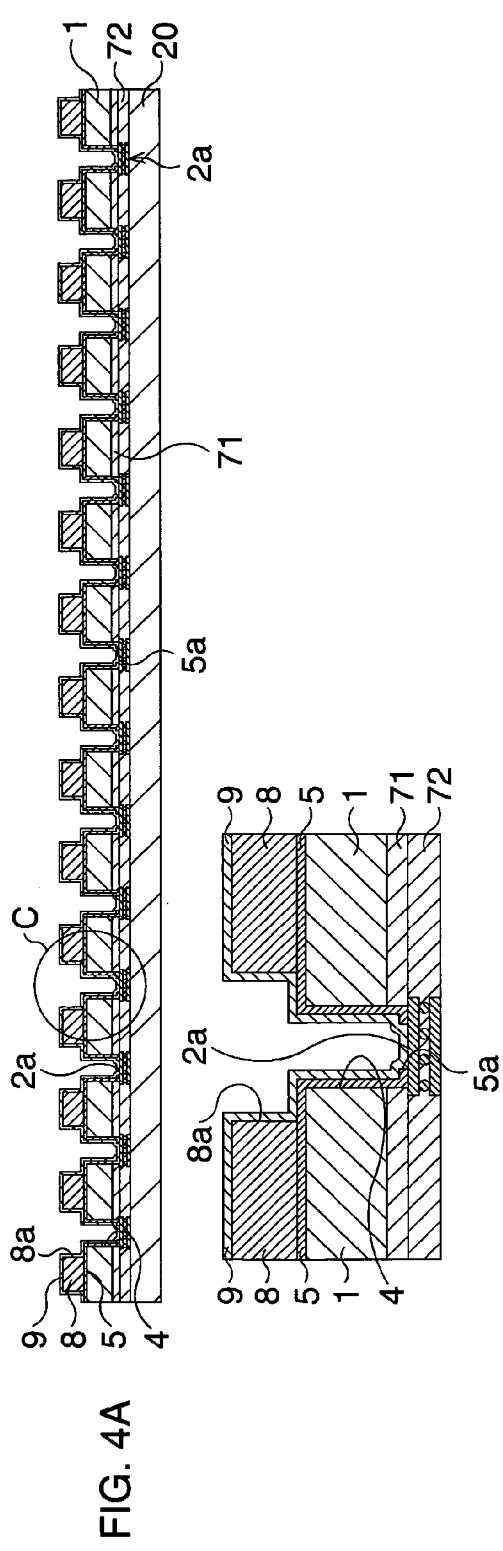
FIGS. 4A and 4B are schematic sectional views sequentially showing process steps of the method of fabricating a semiconductor device according to the first embodiment, as continued from FIG. 3B.

Next, as shown in FIG. 4A, a barrier metal layer 9 typically composed of TaN, TiN and the like is formed on the insulating film 8 by the CVD process or the sputtering process, so as to also cover the inner wall surface of the viaholes 4 and openings 8*a*, and a plating seed layer (not shown) composed of a conductive material, which is Cu herein, is formed by the CVD process or the sputtering process.

Figure 4B:
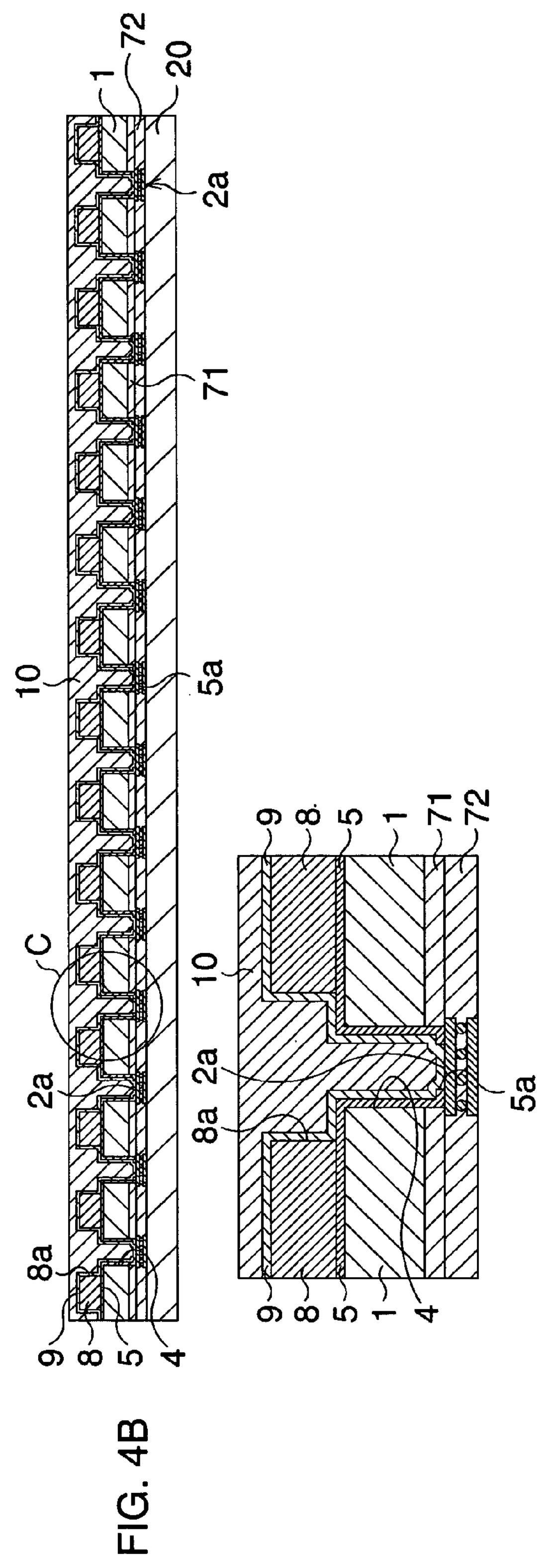

Next, as shown in FIG. 4B, a conductive material, which is Cu 10 herein, is deposited by plating on the barrier metal layer 9 and so as to fill the viaholes 4 and openings 8*a*. As the conductive material, it is also allowable to use, in place of Cu, any of Au, Ag, Ni and Sn, or any alloys of these metals with Cu having an arbitrary alloy composition.

The method of depositing the conductive material may be the vacuum evaporation process or the metal paste process, in place of plating. The metal paste process refers to a method of filling a metal paste into the openings 8*a* up (close) to the top surface of the insulating film 8 and allowing it to solidify.

Figure 5:
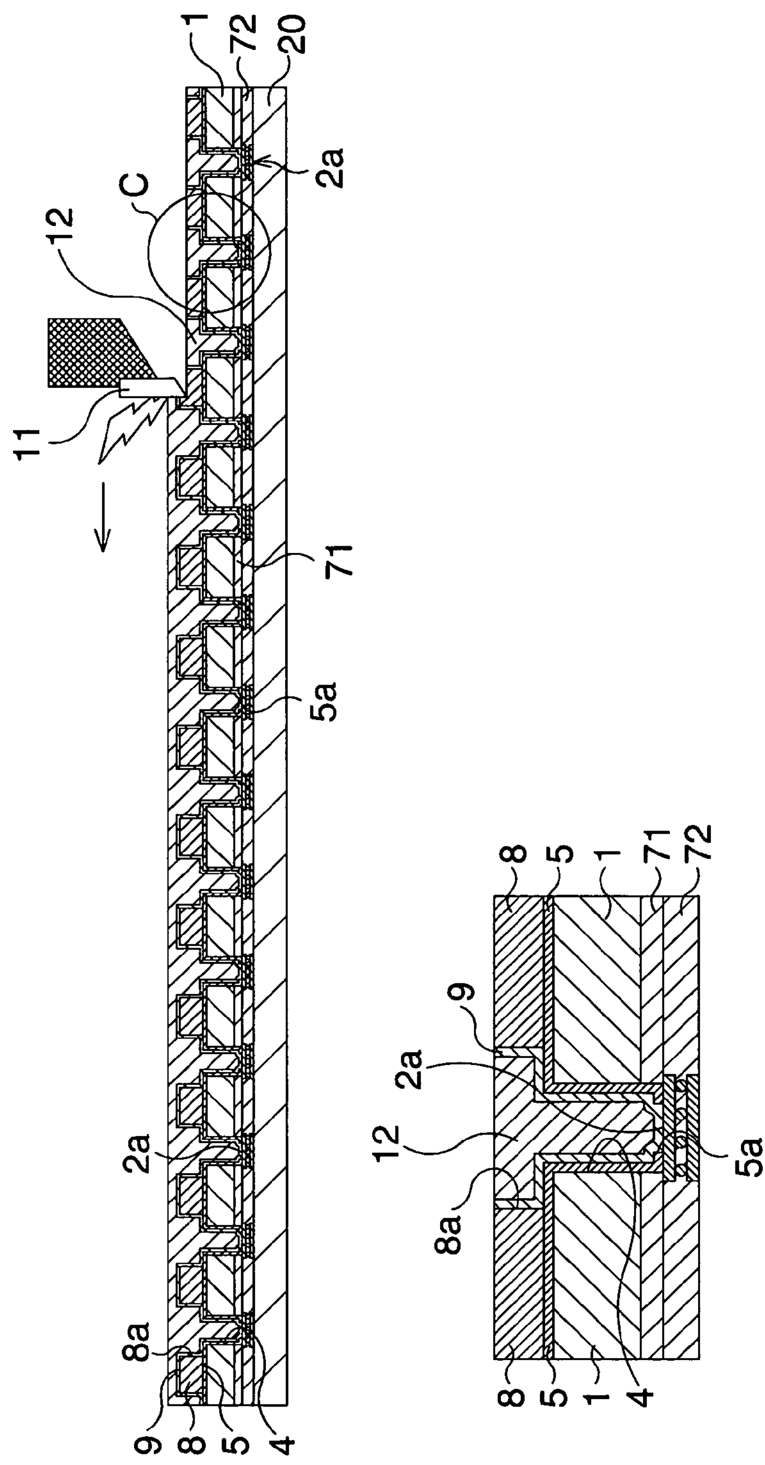
FIG. 5 is a schematic sectional view showing a process step of the method of fabricating a semiconductor device according to the first embodiment, as continued from FIG. 4B.

Next, as shown in FIG. 5, the Cu 10 and the insulating film 8 are subjected to cutting process using a hard bite 11 typically composed of diamond, to thereby remove a portion of the Cu 10 placed on the insulating film 8 and the upper surficial portion of the insulating film 8. This is successful in planarizing the surface of the Cu 10 and the surface of the insulating film 8 while keeping a continuity of the both, in filling the viaholes 4 and openings 8*a* with Cu, and consequently in forming the through electrodes 12 having a leveled height. The through electrodes 12 are formed so as to penetrate the silicon semiconductor substrate 1 from the back surface thereof, and so as to electrically contact with the LSI elements through the terminal portions 2*a* at the bottom of the viaholes 4.

As described in the above, the present embodiment makes it possible to form the through electrode 12 capable of ensuring a sufficient insulation from the substrate and mechanical strength in a simple and exact manner, to thereby realize a highly-reliable semiconductor device. Resistance of the through electrodes 12 against mechanical impact can further be improved and ensured by eliminating variation in height of the laterally-arranged individual through electrodes 12 in a simple manner to an advanced degree, and at the same time by planarizing the surface of the through electrodes 12 and the surface of the insulating film 8 burying these through electrodes 12 while keeping a continuity of the both.

Second Embodiment

In this embodiment, a specific example of the semiconductor device having, disposed thereon, a film having an electronic circuit buried therein, and having through electrodes connected to the electronic circuit will be described together with a method of fabricating the same.

FIGS. 11A to 16 are schematic sectional views sequentially showing process steps of a method of fabricating a semiconductor device according to a second embodiment. It is to be noted that, in the individual drawings from FIGS. 11 and 13A to 16, a portion surrounded by a circle C in the upper illustration (corresponded to the circumferential area of one terminal portion 41*a*) is given as an enlarged view in the lower illustration.

Figure 11:
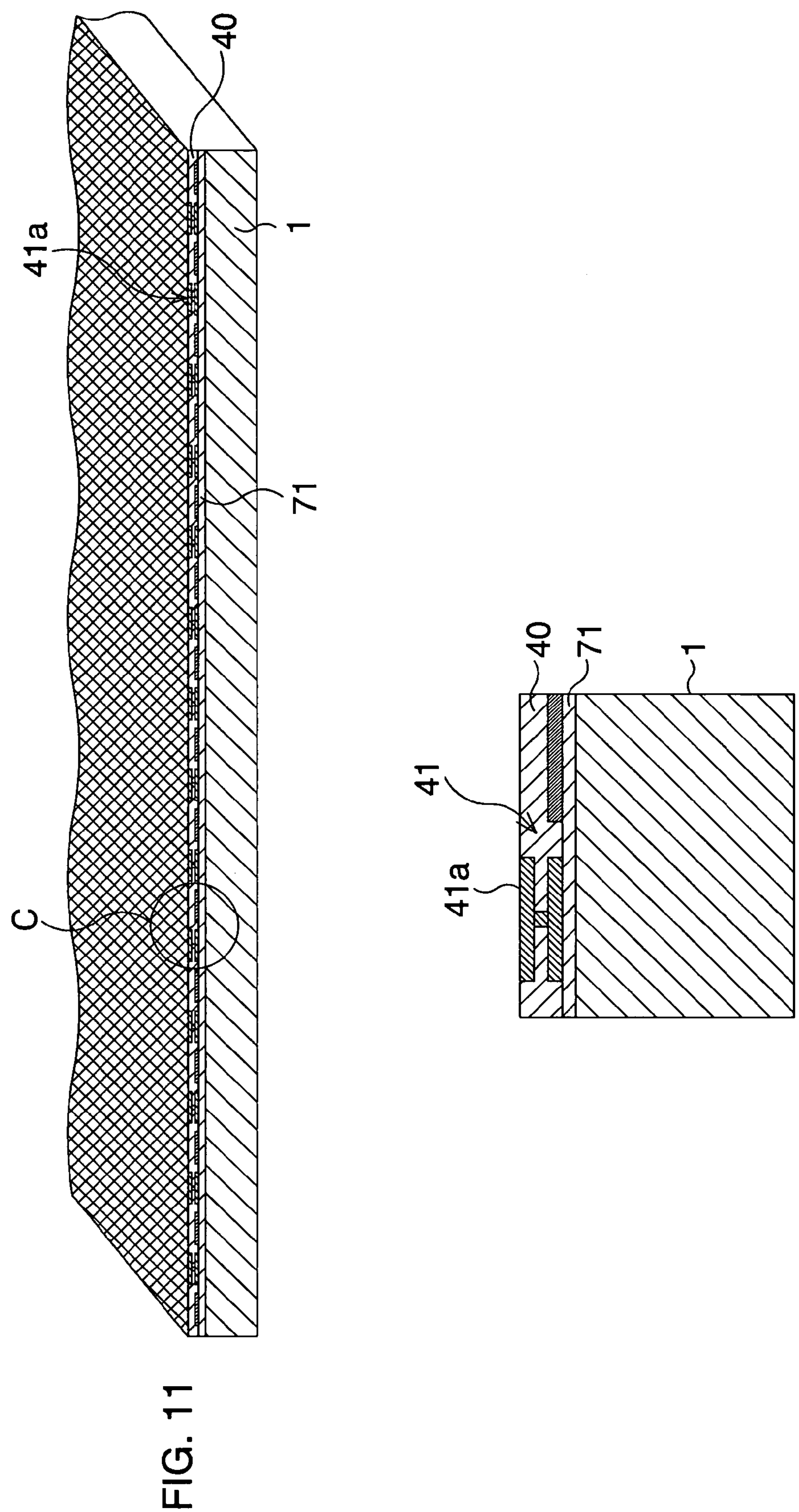
FIG. 11 is a schematic sectional view showing a process step of a method of fabricating a semiconductor device according to a second embodiment.

First as shown in FIG. 11, a silicon semiconductor substrate 1 having a thickness of 100 μm or around is obtained. A thin-film electronic circuit 41 is then formed on the surface of the substrate, where the thin-film electronic circuit 41 comprises an impurity-diffused region 71 having impurity-diffused layers of the individual semiconductor elements formed therein and being disposed on the substrate side; and an insulating film 40 formed on the impurity-diffused region 71, having a plurality of LSI elements and so forth buried therein. The thin-film electronic circuit 41 has terminal portions 41*a*, each of which comprising two patterned conductors connected through a viahole. It is to be noted that the insulating film 40 is not shown in the upper illustrations of FIGS. 11, and 13A to 16 for simplicity.

Figure 12A:
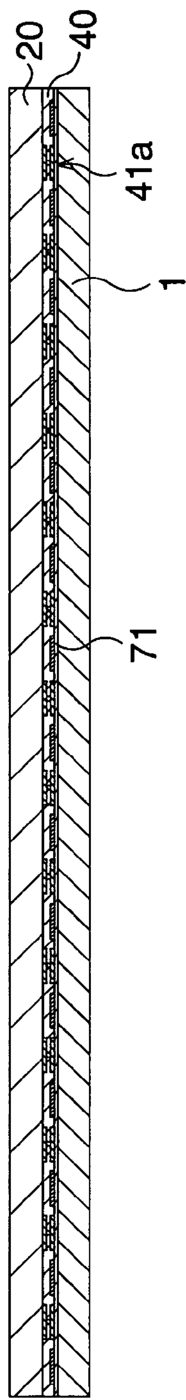
FIGS. 12A to 12C are schematic sectional views sequentially showing process steps of a method of fabricating a semiconductor device according to a second embodiment, as continued from FIG. 12.

Next, as shown in FIG. 12A, the surface of the silicon semiconductor substrate 1 is attached to a base 20, composed of quartz or glass, using a UV tape or the like, and the silicon semiconductor substrate 1 is then thinned to as thin as approximately 50 μm to 200 μm by grinding or etching the back surface of the silicon semiconductor substrate 1. For the case where the initial thickness of the silicon semiconductor substrate 1 is not uniform, or the non-uniformity is further accompanied by some waviness, it is preferable to obtain a substrate support (not shown) having a flat supporting surface, onto which the silicon semiconductor substrate 1 is fixed by adsorption, and more specifically by allowing the surface of the silicon semiconductor substrate 1 to be adsorbed by vacuum adsorption, for example. By this procedure, the surface of the silicon semiconductor substrate 1 is forcedly flattened by the adsorption onto the supporting surface, and the flattened surface gives a reference plane for planarization of the back surface. As described in the above, thickness of the silicon semiconductor substrate 1 can be adjusted also by mechanically grinding the back surface while assuming the surface of the substrate as a reference plane for the planarization of the back surface, to thereby remove any convex portions on the back surface by grinding, and to accomplish planarization.

Figure 12B:
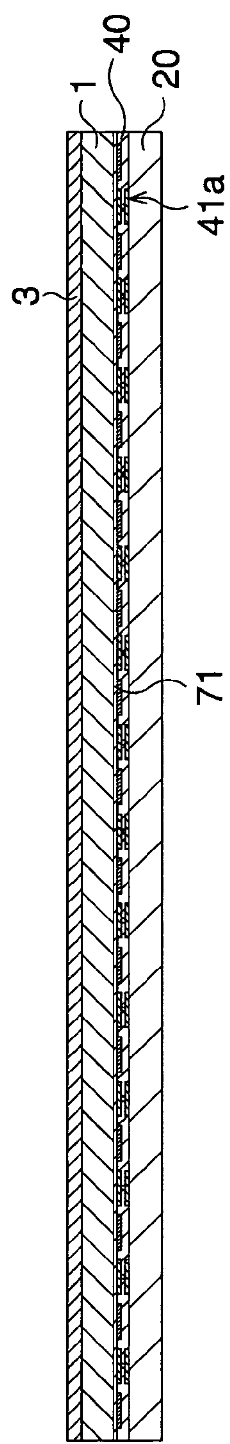

Next, as shown in FIG. 12B, the photoresist 3 is coated on the back surface of the silicon semiconductor substrate 1.

Figure 12C:
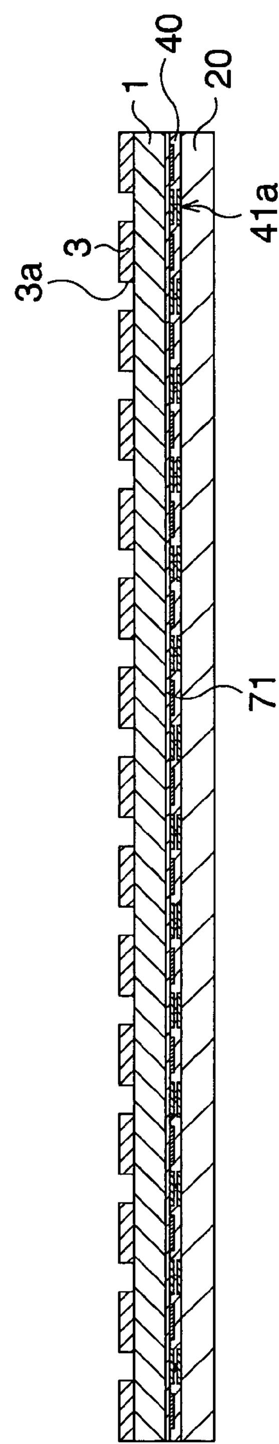

Next, as shown in FIG. 12C, the photoresist 3 is processed by photolithography to thereby form the openings 3*a* at projected sites of the individual terminal portions 41*a*.

Figure 13A:
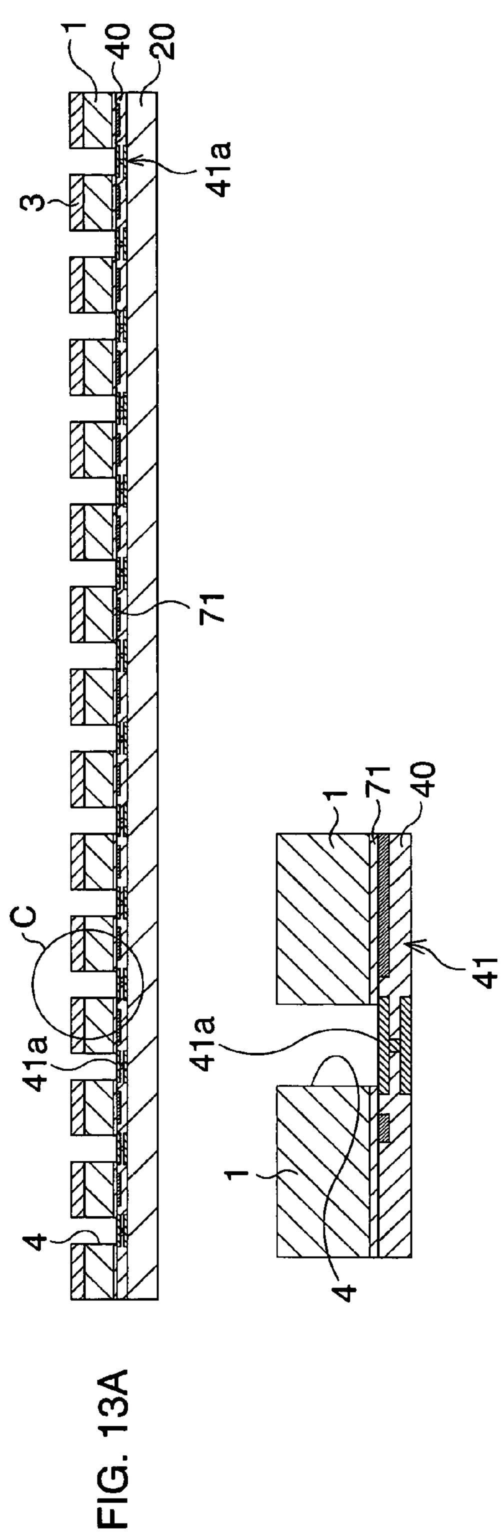
FIGS. 13A and 13B are schematic sectional views sequentially showing process steps of the method of fabricating a semiconductor device according to the second embodiment, as continued from FIG. 12C.

Next, as shown in FIG. 13A, the silicon semiconductor substrate 1 and insulating film 40, under masking by the photoresist 3, are etched from the back surface. The dry etching is typically proceeded in an ICP apparatus for 10 minutes under alternate supply of $C_4F_8$ gas and $SF_6$ gas, to thereby form the viaholes 4 of approximately 50 μm in diameter, and 100 μm in depth, in which a part of the individual terminal portions 41*a* is exposed.

Figure 13B:
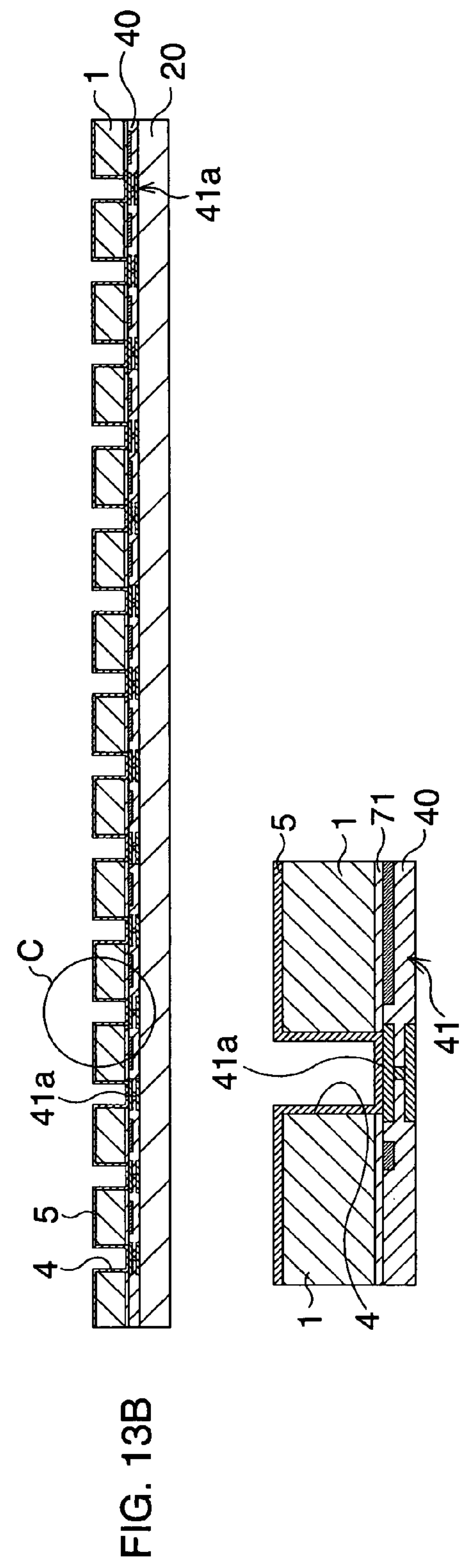

Next, the photoresist 3 is removed typically by ashing. More specifically, the ashing process herein is proceeded so that the photoresist 3 is immersed in an alkaline solution, and is then irradiated with oxygen plasma to thereby remove the residue by ashing. Next, as shown in FIG. 13B, the insulating film 5, which is typically composed of $SiO_2$ or SiN, is formed to a thickness of 200 nm or around typically by the CVD process, on the back surface of the silicon semiconductor substrate 1 so as to cover the inner wall surface of the viaholes 4.

Figure 14A:
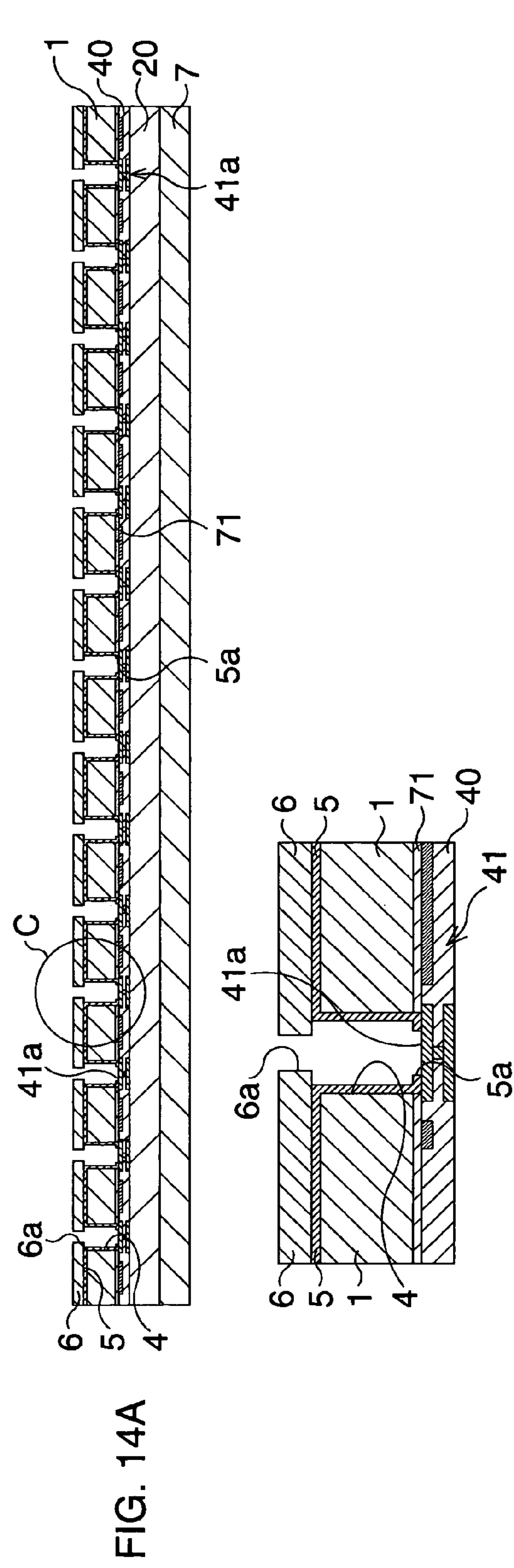
FIGS. 14A and 14B are schematic sectional views sequentially showing process steps of the method of fabricating a semiconductor device according to the second embodiment, as continued from FIG. 13B.

Next, as shown in FIG. 14A, the metal mask 6 is placed on the insulating film 5. The metal mask 6 has, formed therein, the openings 6*a* having a diameter smaller than that of the viaholes 4, as being aligned with position of formation of the viaholes 4, and is stacked on the insulating film 5 based on alignment on the back surface of the silicon semiconductor substrate 1 so as to allow each opening 6*a* to fall within each viahole 4 (that is, the outer circumference of the opening 6*a* comes inside the outer circumference of the viahole 4). Position of the metal mask 6 is then fixed with the aid of magnetic force given by a magnet 7 disposed under the base 20.

The insulating film 5 is then dry-etched under masking by the metal mask 6. The dry etching herein is proceeded in an ICP apparatus for 5 minutes using a mixed gas of $C_4f_8$ and $SF_6$. By the etching, a portion 5*a* of the insulating film 5 at the bottom of the viahole 4 and in a projected site of the opening 6*a* is removed, and thereby a part of the surface of the terminal portion 41*a* exposes.

Figure 14B:
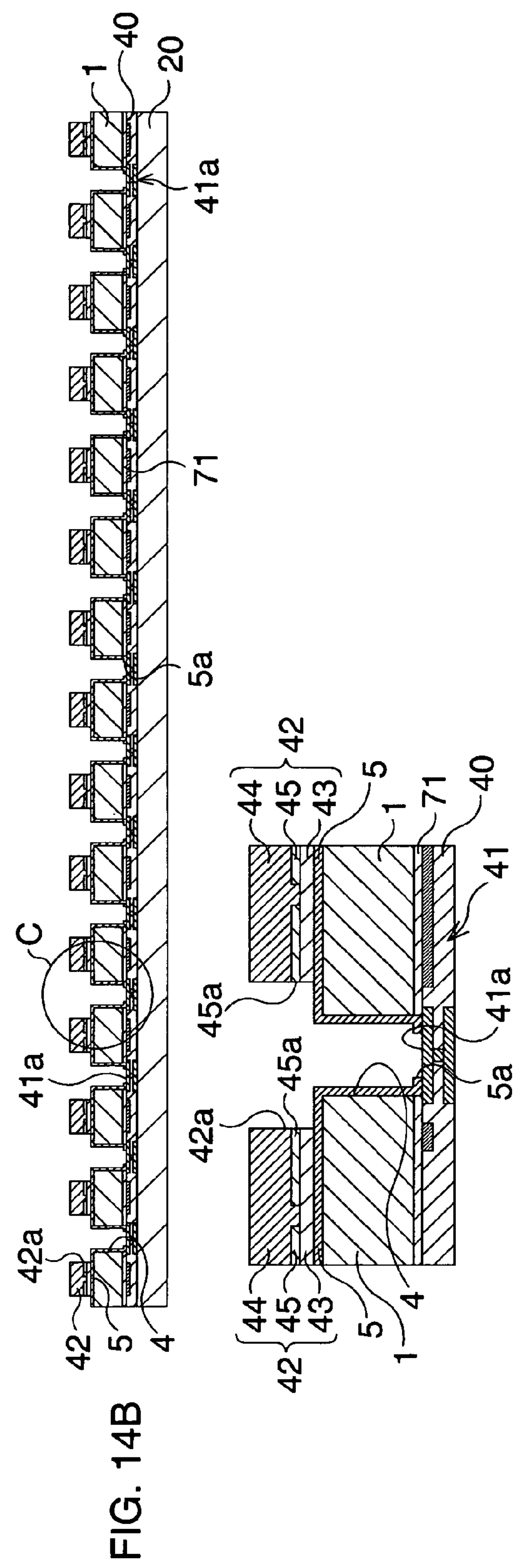

The metal mask 6 is then removed, and as shown in FIG. 14B, an insulating film 42 thicker than the insulating film 5 is placed on the insulating film 5. The insulating film 42 comprises an adhesive layer 43 typically composed of an epoxy resin and disposed on the lower side, and a cuttable insulating resin layer 44 composed of an organic insulating material, which is typically polyimide herein, disposed on the upper side. The insulating resin layer 44 has, buried therein, thin-film electronic circuits 45, each of which comprises capacitors, inductors, wirings and so forth. The thin-film electronic circuit 45 herein is a Cu wiring, for example, and thicknesses of the adhesive layer 43, thin-film electronic circuit 45 and insulating resin layer 44 are approximately 10 nm, 5 nm and 20 nm, respectively. The insulating film 42 has, formed therein, openings 42*a* having a diameter larger than that of the viaholes 4, as being aligned with position of formation of the viaholes 4, having a contact portion 45*a* of the thin-film electronic circuit 45 exposed on the inner wall surface of each opening 42*a*, and is placed on the back surface of the silicon semiconductor substrate 1 using an adhesive layer 43 based on alignment on the back surface of the silicon semiconductor substrate 1, so as to allow each viahole 4 to fall within each opening 42*a* (by baking at 170° C. for 1 hour). Heat-resistant temperature of the insulating film 42 is set higher than a maximum temperature possibly reached during the formation process of the through electrode described later.

Specific methods of placing the insulating film 42 include a method in which the insulating film 42 is sized corresponding to a predetermined LSI element in the thin-film electronic circuit 42, and placed as being aligned with each predetermined LSI element, similarly to as described above in the first embodiment referring to FIG. 6; and a method in which the insulating film 42 is sized corresponding to a block 30 consisting of a plurality of the LSI elements, and is placed as being aligned with each block 30, similarly to as described above in the first embodiment referring to FIG. 7. It is to be noted that the present embodiment mainly exemplifies the case shown in FIG. 7.

Figure 15A:
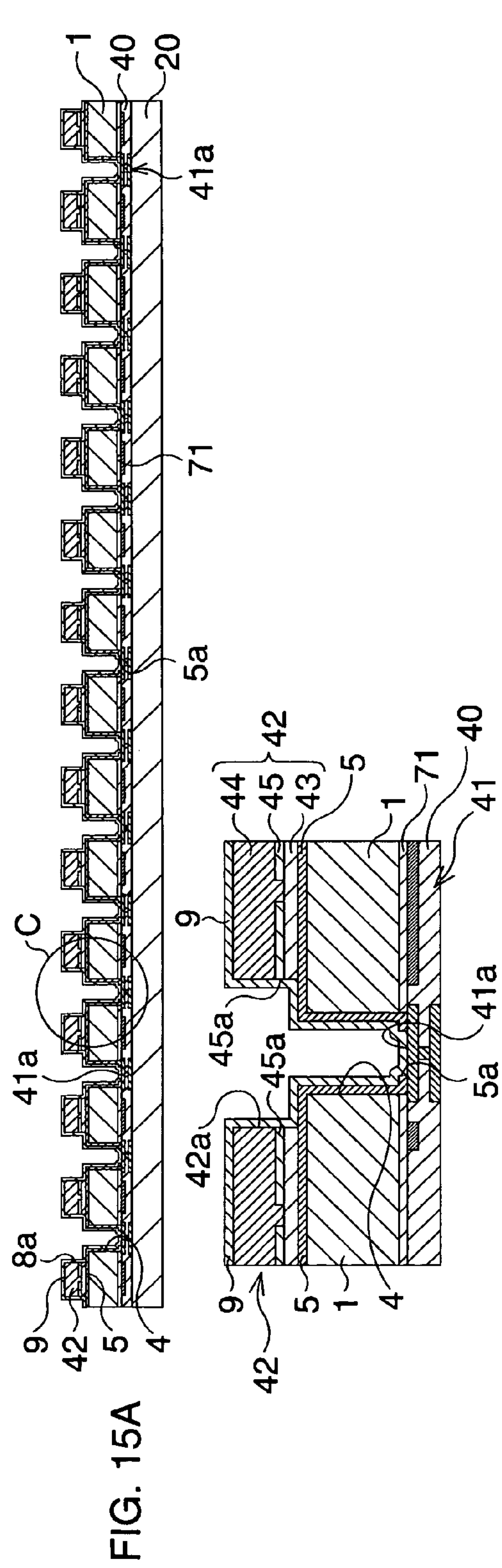
FIGS. 15A and 15B are schematic sectional views sequentially showing process steps of the method of fabricating a semiconductor device according to the second embodiment, as continued from FIG. 14B.

Next, as shown in FIG. 15A, the barrier metal layer 9 typically composed of TaN, TiN and the like is formed on the insulating film 42 by the CVD process or the sputtering process, so as to also cover the inner wall surface of the viaholes 4 and openings 42*a*, and a plating seed layer (not-shown) composed of a conductive material, which is Cu herein, is formed by the CVD process or the sputtering process. The plating seed layer formed herein is Cr/Cu having a thickness of 100 nm/20 nm or around.

Figure 15B:
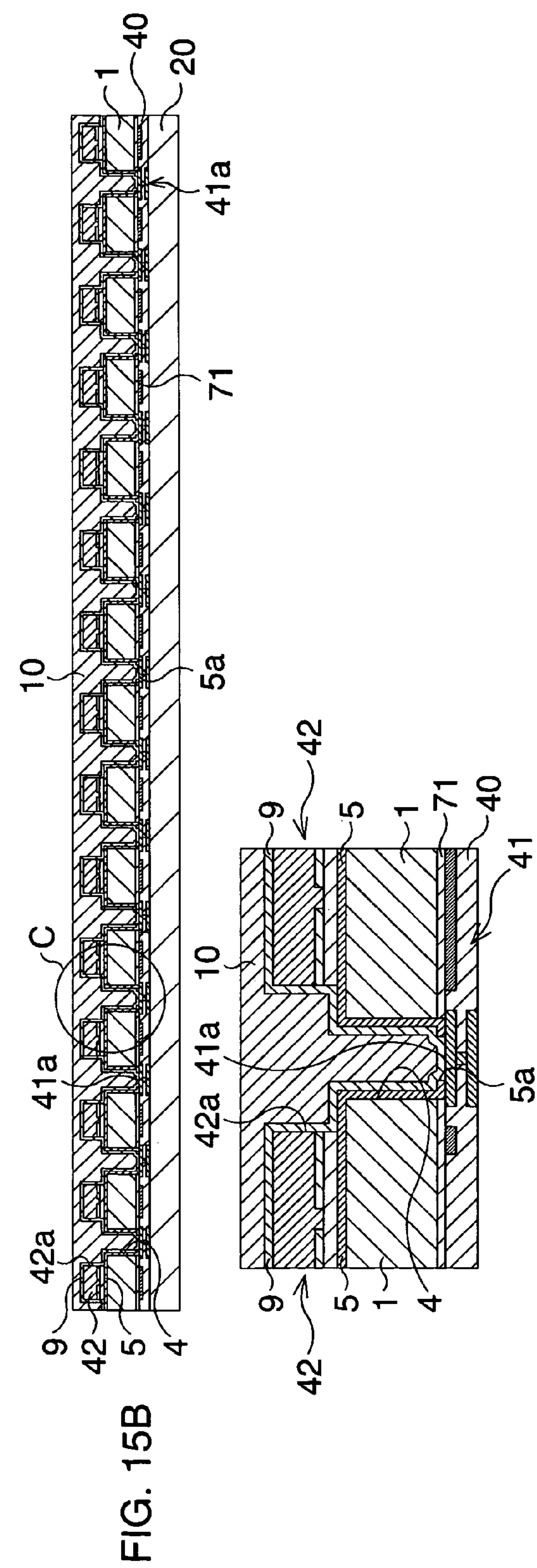

Next, as shown in FIG. 15B, a conductive material, which is the Cu 10 herein, is deposited by plating on the barrier metal layer 9 and so as to fill the viaholes 4 and openings 42*a*. As the conductive material, it is also allowable to use, in place of Cu, any of Au, Ag, Ni and Sn, or any alloys of these metals with Cu having an arbitrary alloy composition.

The method of depositing the conductive material may be the vacuum evaporation process or the metal paste process, in place of plating. The metal paste process refers to a method of filling a metal paste into the openings 42*a* up (close) to the top surface of the insulating film 42 and allowing it to solidify.

Figure 16:
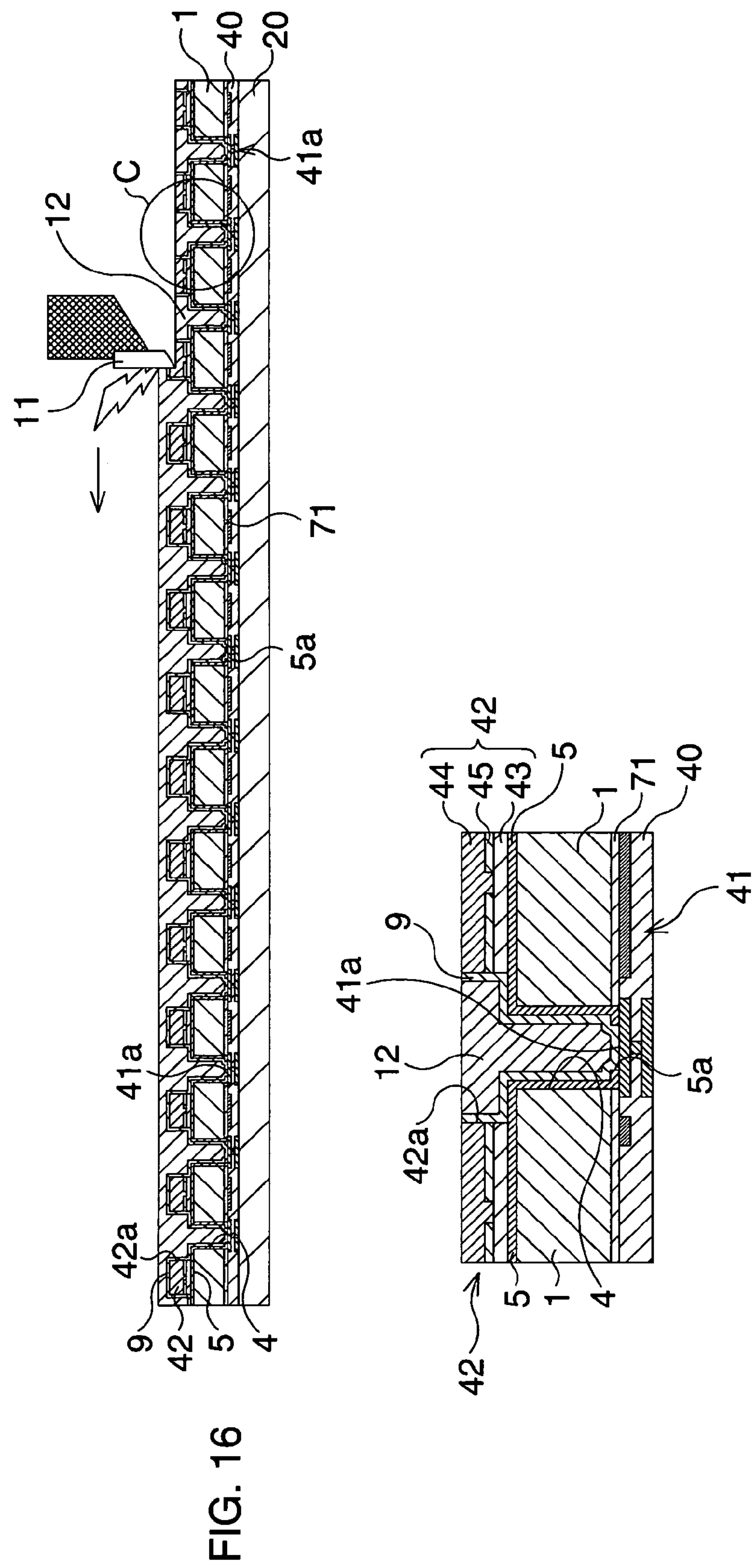
FIG. 16 is a schematic sectional view showing a process step of the method of fabricating a semiconductor device according to the second embodiment, as continued from FIG. 15B.

Next, as shown in FIG. 16, the Cu 10 and the insulating film 42 are subjected to cutting process using the hard bite 11 typically composed of diamond, to thereby remove a portion of the Cu 10 placed on the insulating film 42, and the upper surficial portion of the insulating resin layer 44 of the insulating film 42, where the surficial portion is approximately 4 μm in thickness. This is successful in planarizing the surface of the Cu 10 and the surface of the insulating film 42 while keeping a continuity of the both, in filling the viaholes 4 and openings 42*a* with Cu, and consequently in forming the through electrodes 12 having a leveled height. Each through electrode 12 is formed so as to penetrate the silicon semiconductor substrate 1 from the back surface thereof, and so as to electrically contact respectively with the thin-film electronic circuit 41 through the terminal portion 41*a* at the bottom of the viahole 4, and with the thin-film electronic circuit 45 through the terminal portion 45*a* at the lateral portion of the inner wall surface of the opening 42*a*.

As described in the above, the present embodiment relates to the semiconductor device having the thin-film electronic circuit 41 on the first main surface (top surface, for example) of the silicon semiconductor substrate 1, the insulating film 42 having the thin-film electronic circuit 45 buried therein on the second main surface (back surface, for example), and can be realized as a highly-reliable semiconductor device based on a process of connecting the thin-film electronic circuits 41, 45 through the through electrode 12, by which the through electrode 12 capable of ensuring a sufficient insulation from the silicon semiconductor substrate 1 and mechanical strength can be formed in a simple and exact manner, even if the CMP process of the surface of the through electrode and photolithographic wiring formation process are simplified. In the present embodiment, resistance of the through electrodes 12 against mechanical impact can further be improved and ensured by eliminating variation in height of the laterally-arranged individual through electrodes 12 in a simple manner to an advanced degree, and at the same time by planarizing the surface of the through electrodes 12 and the surface of the insulating film 42 burying these through electrodes 12, while keeping a continuity of the both.

MODIFIED EXAMPLES

The following paragraphs will describe modified example of the second embodiment.

Modified Example 1

Modified example 1 exemplifies a case in which an electrode, which is connected to the thin-film electronic circuit 45, is formed on the back surface of the silicon semiconductor substrate 1 in adjacent to the through electrode 12, referring to FIGS. 17A to 18B. It is to be noted that FIGS. 17A to 18B give enlarged views of only an area around the terminal portion 41.

First, by carrying out the process steps similar to those shown in FIGS. 11 to 14A in the second embodiment, the portion 5*a* of the insulating film 5 at the bottom of the viahole 4 and in a projected site of the opening 6*a* is removed, to thereby exposed a part of the surface of the terminal portion 41*a*.

Figure 17A:
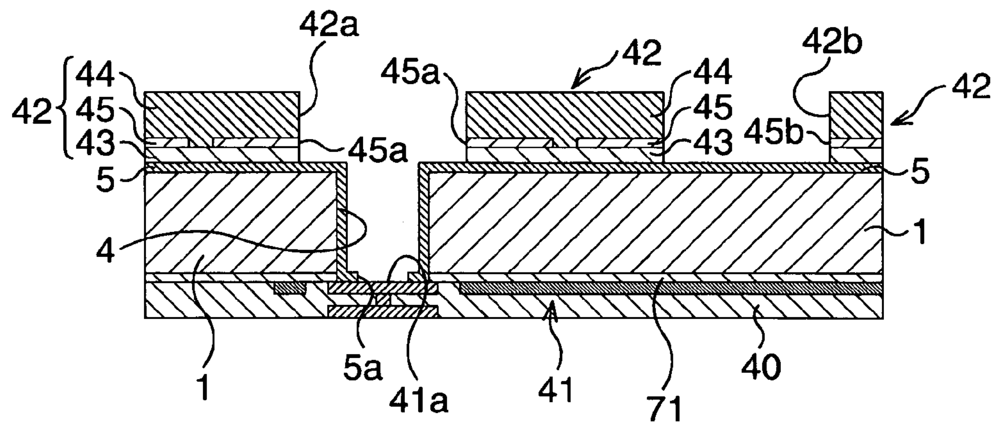
FIGS. 17A to 17C are schematic sectional views sequentially showing process steps of a method of fabricating a semiconductor device according to a modified example 1 of the second embodiment.

The metal mask 6 is then removed, and as shown in FIG. 17A, an insulating film 42 thicker than the insulating film 5 is placed on the insulating film 5. The insulating film 42 comprises an adhesive layer 43 typically composed of an epoxy resin and disposed on the lower side, and a cuttable insulating resin layer 44 composed of an organic insulating material, which is typically epoxy resin herein, disposed on the upper side. The insulating resin layer 44 has, buried therein, a thin-film electronic circuit 45 which comprises capacitors, inductors, wirings and so forth. The thin-film electronic circuit 45 herein is a Cu wiring, for example, and thicknesses of the adhesive layer 43, thin-film electronic circuit 45 and insulating resin layer 44 are approximately 10 nm, 5 nm and 20 nm, respectively. The insulating film 42 has, formed therein, openings 42*a* having a diameter larger than that of the viaholes 4, and openings 42*b* in adjacent to the viaholes 4, in which the contact portion 45*a* of the thin-film electronic circuit 45 is exposed on the inner wall surface of each opening 42*a*, and a contact portion 45*b* of the thin-film electronic circuit 45 is exposed on the inner wall surface of each opening 42*b*. The insulating film 42 is placed on the back surface of the silicon semiconductor substrate 1 using an adhesive layer 43 based on alignment on the back surface of the silicon semiconductor substrate 1, so as to allow each viahole 4 to fall within each opening 42*a*. Heat-resistant temperature of the insulating film 42 is set higher than a maximum temperature possibly reached during the formation process of the through electrode described later.

Figure 17B:
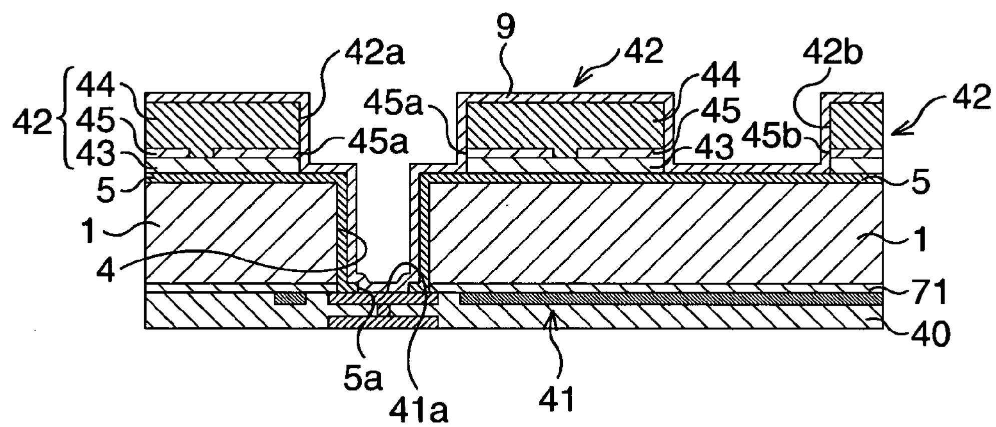

Next, as shown in FIG. 17B, a barrier metal layer 9 typically composed of TaN, TiN and the like is formed on the insulating film 8 by the CVD process or the sputtering process, so as to also cover the inner wall surfaces of the viaholes 4 and openings 42*a*, 42*b*, and a plating seed layer (not shown) composed of a conductive material, which is Cu herein, is formed by the CVD process or the sputtering process.

Figure 17C:
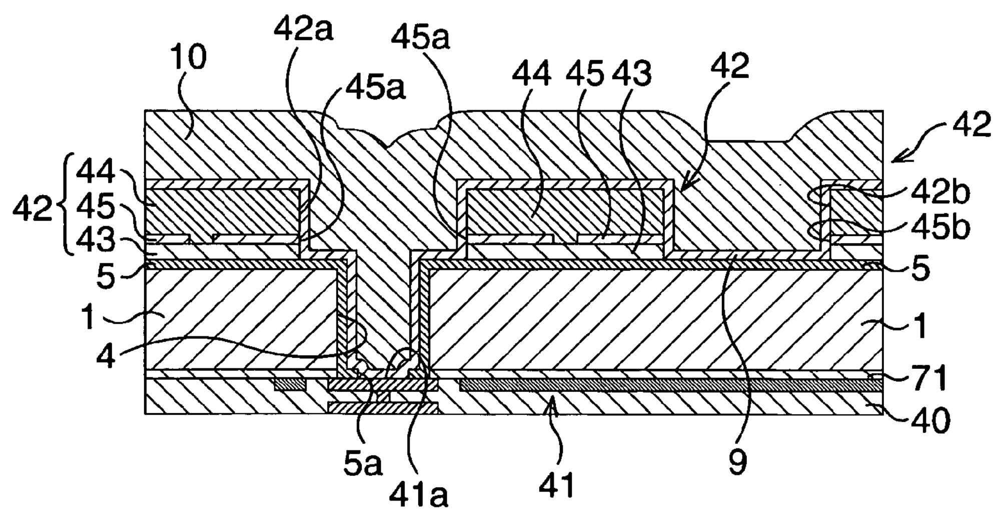

Next, as shown in FIG. 17C, a conductive material, which is Cu 10 herein, is deposited by plating on the barrier metal layer 9 and so as to fill the viaholes 4 and openings 42*a*, 42*b*. As the conductive material, it is also allowable to use, in place of Cu, any of Au, Ag, Ni and Sn, or any alloys of these metals with Cu having an arbitrary alloy composition.

The method of depositing the conductive material may be the vacuum evaporation process or the metal paste process, in place of plating. The metal paste process refers to a method of filling a metal paste into the openings 42*a*, 42*b* up (close) to the top surface of the insulating film 42 and allowing it to solidify.

Figure 18A:
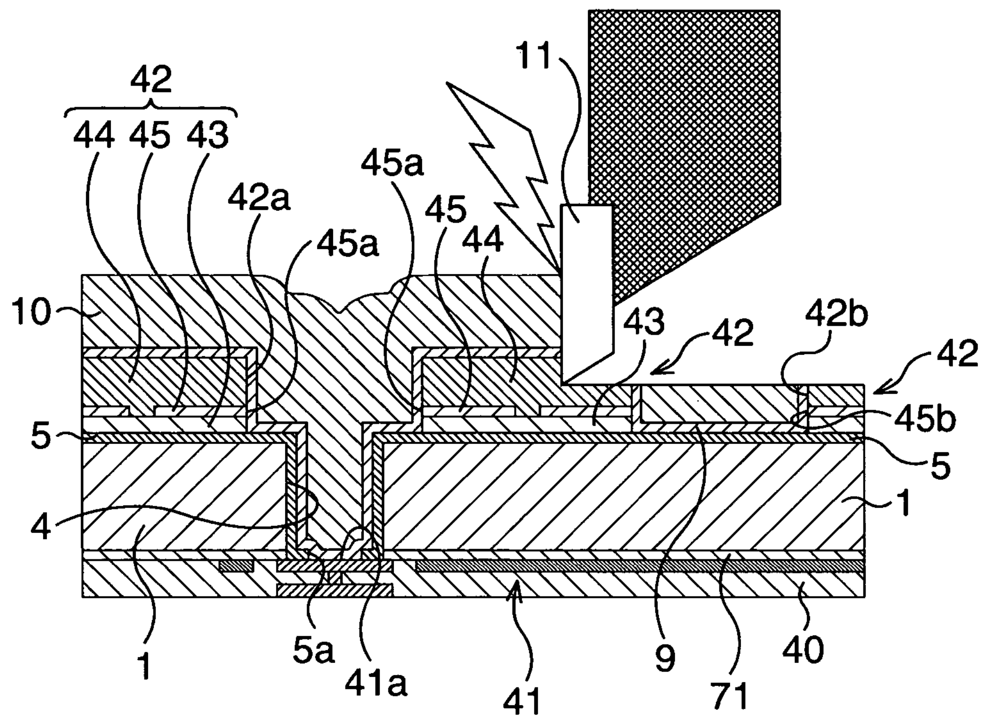
FIGS. 18A and 18B are schematic sectional views sequentially showing process steps of the method of fabricating a semiconductor device according to the modified example 1 of the second embodiment, as continued from FIG. 17C.
Figure 18B:
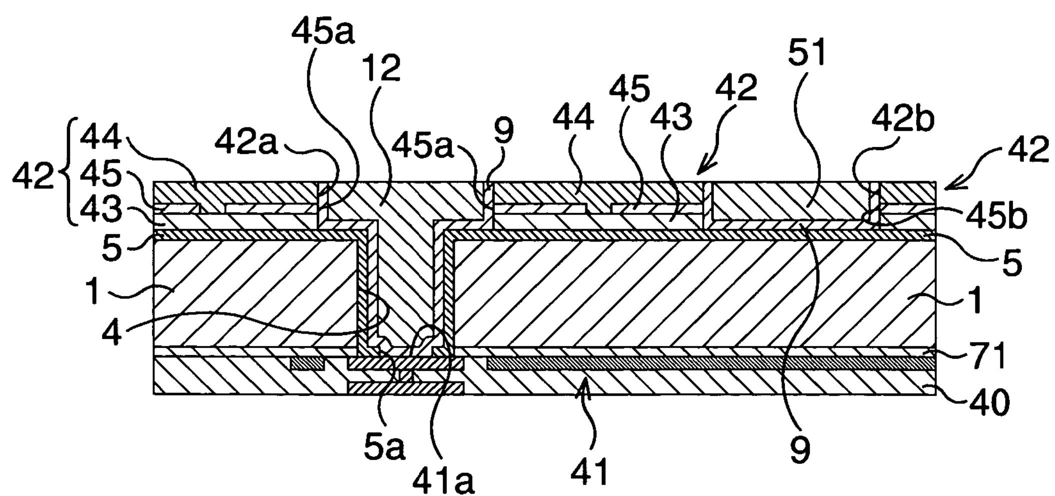

Next, as shown in FIG. 18A, the Cu 10 and the insulating film 42 are subjected to cutting process using a hard bite 11 typically composed of diamond, to thereby remove a portion of the Cu 10 placed on the insulating film 42, and the upper surficial portion of the insulating resin layer 44 of the insulating film 42. This is successful in planarizing the surface of the Cu 10 and the surface of the insulating film 42 while keeping a continuity of the both, in filling the viaholes 4 and openings 42*a* with Cu to thereby form the through electrodes 12 having a leveled height, and in filling the openings 42*b* with Cu to thereby form the electrodes 51 having a leveled height. Each through electrode 12 is formed so as to penetrate the silicon semiconductor substrate 1 from the back surface thereof, and so as to electrically contact respectively with the thin-film electronic circuit 41 through the terminal portion 41*a* at the bottom of the viahole 4, and with the thin-film electronic circuit 45 through the terminal portion 45*a* at the lateral portion of the inner wall surface of the opening 42*a*. On the other hand, each electrode 51 electrically contacts with the thin-film electronic circuit 45 through the terminal portion 45*b* at the lateral portion of the inner wall surface of the opening 42*b*. It is to be noted that the through electrode 12 and electrode 51 may electrically be connected within the thin-film electronic circuit 45, or may not be.

As described in the above, the present embodiment relates to the semiconductor device having the thin-film electronic circuit 41 on the first main surface (top surface, for example) of the silicon semiconductor substrate 1, the insulating film 42 having the thin-film electronic circuit 45 buried therein on the second main surface (back surface, for example), and can be realized as a highly-reliable semiconductor device based on a process of connecting the thin-film electronic circuits 41, 45 through the through electrode 12, and a process of connecting the thin-film electronic circuit 45 and electrode 51, by which the through electrode 12 and electrode 51 capable of ensuring a sufficient insulation from the silicon semiconductor substrate 1 and mechanical strength can be formed in a simple and exact manner, even if the CMP process of the surface of the through electrode and photolithographic wiring formation process are simplified. In the present embodiment, resistance of the through electrode 12 and electrode 51 against mechanical impact can further be improved and ensured by eliminating variation in height of the laterally-arranged individual through electrodes 12 and electrodes 51 in a simple manner to an advanced degree, and at the same time by planarizing the surfaces of the through electrodes 12 and electrodes 51, and the surface of the insulating film 42 burying these electrodes, while keeping a continuity of the both.

Modified Example 2

In modified example 2, several examples of the opening 42*a* of the insulating film 42, which differ in the shape, are explained referring to FIGS. 19A to 19D. It is to be noted that FIGS. 19A to 19D show only the insulating film 42 for the convenient sake of illustration.

Figure 19A:
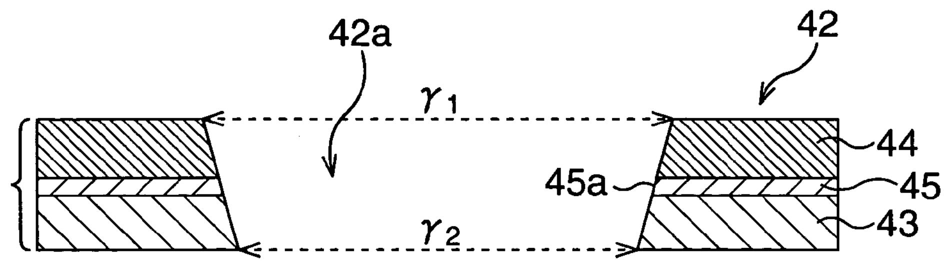
FIGS. 19A to 19D are schematic sectional views sequentially showing process steps of a method of fabricating a semiconductor device according to a modified example 2 of the second embodiment.

(1) FIG. 19A discloses a case in which the opening 42*a* of the insulating film 42 has a tapered inner wall surface, where the diameter $r_1$ of the opening 42*a* on the top surface is larger than the diameter $r_2$ on the bottom surface to be placed on the semiconductor substrate 1. Formation of thus-shaped opening 42*a* makes it possible to exactly fill the opening 42*a* with the Cu 10, and to obtain a sure connection between the Cu 10 and the connection portion 45*a* of the thin-film electronic circuit 45.

Figure 19B:
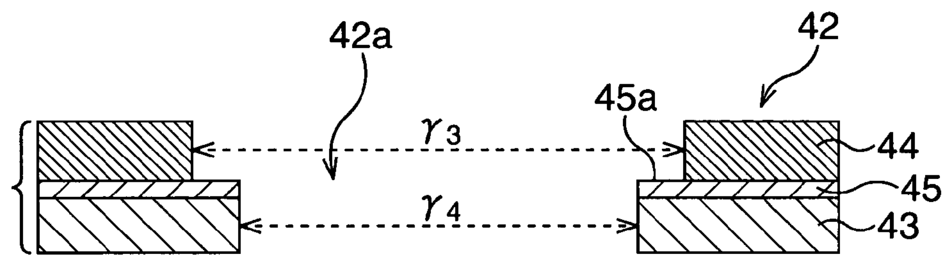

(2) FIG. 19B discloses a case in which the opening 42*a* of the insulating film 42 is configured so as to have a diameter $r_4$ in the opened portion of the contact portion 45*a* and adhesive layer 43 smaller than a diameter $r_3$ in the opened portion of the insulating resin layer 44. This allows the side face and top face of the contact portion 45*a* to expose out into the side wall surface of the opening 42*a*, and this makes it possible to enlarge the contact area with the Cu 10 to thereby further improve the sure connection. Formation of thus-shaped opening 42*a* can possibly be obtained typically by forming an opening in the insulating film 42 to a diameter equivalent to that in the opened portion of the contact portion 45*a* and adhesive layer 43, and then by enlarging only the diameter of the opened portion of the insulating resin layer 44 by ashing.

Figure 19C:
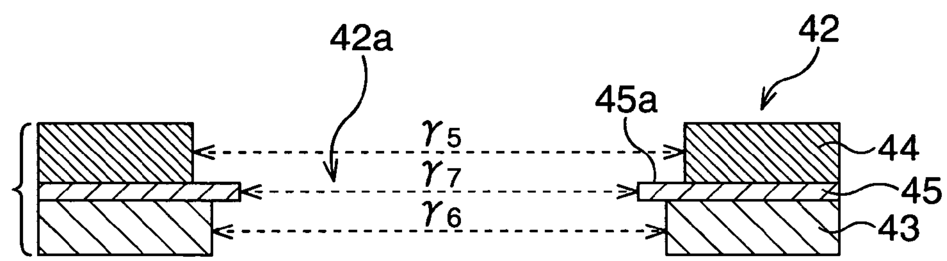

(3) FIG. 19C discloses a case in which the opening 42*a* of the insulating film 42 is configured so as to have a diameter $r_7$ in the opened portion of the contact portion 45*a* larger than a diameter $r_5$ in the opened portion of the insulating resin layer 44 and a diameter $r_6$ in the opened portion of the adhesive layer 43. This allows the contact portion 45*a* to protrude out from the side wall surface of the opening 42*a*, and this makes it possible to enlarge the contact area with the Cu 10 to thereby further improve the sure connection. Formation of thus-shaped opening 42*a* can possibly be obtained typically by forming an opening in the insulating film 42 to a diameter equivalent to that in the opened portion of the contact portion 45*a*, and then by enlarging the diameters of the opened portions of the insulating resin layer 44 and adhesive layer 43 by ashing.

Figure 19D:
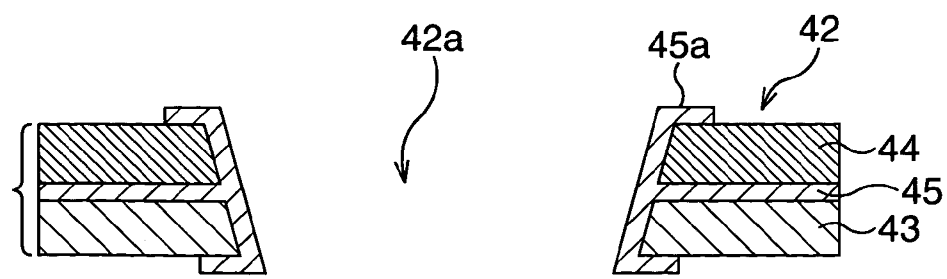

(4) FIG. 19D discloses a case in which the opening 42*a* of the insulating film 42 has a tapered inner wall surface as shown in FIG. 19A, and the contact portion 45*a* is formed so as to cover the inner wall surface of the opening 42*a*. This makes it possible to extremely enlarge the contact area with the Cu 10 to thereby further improve the sure connection.

Third Embodiment

In this embodiment, a specific example of a composite semiconductor device, in which a plurality of semiconductor devices having the through electrode as explained in the first embodiment are stacked under connection, will be described together with a method of fabricating the same.

Figures 24A, 24B:
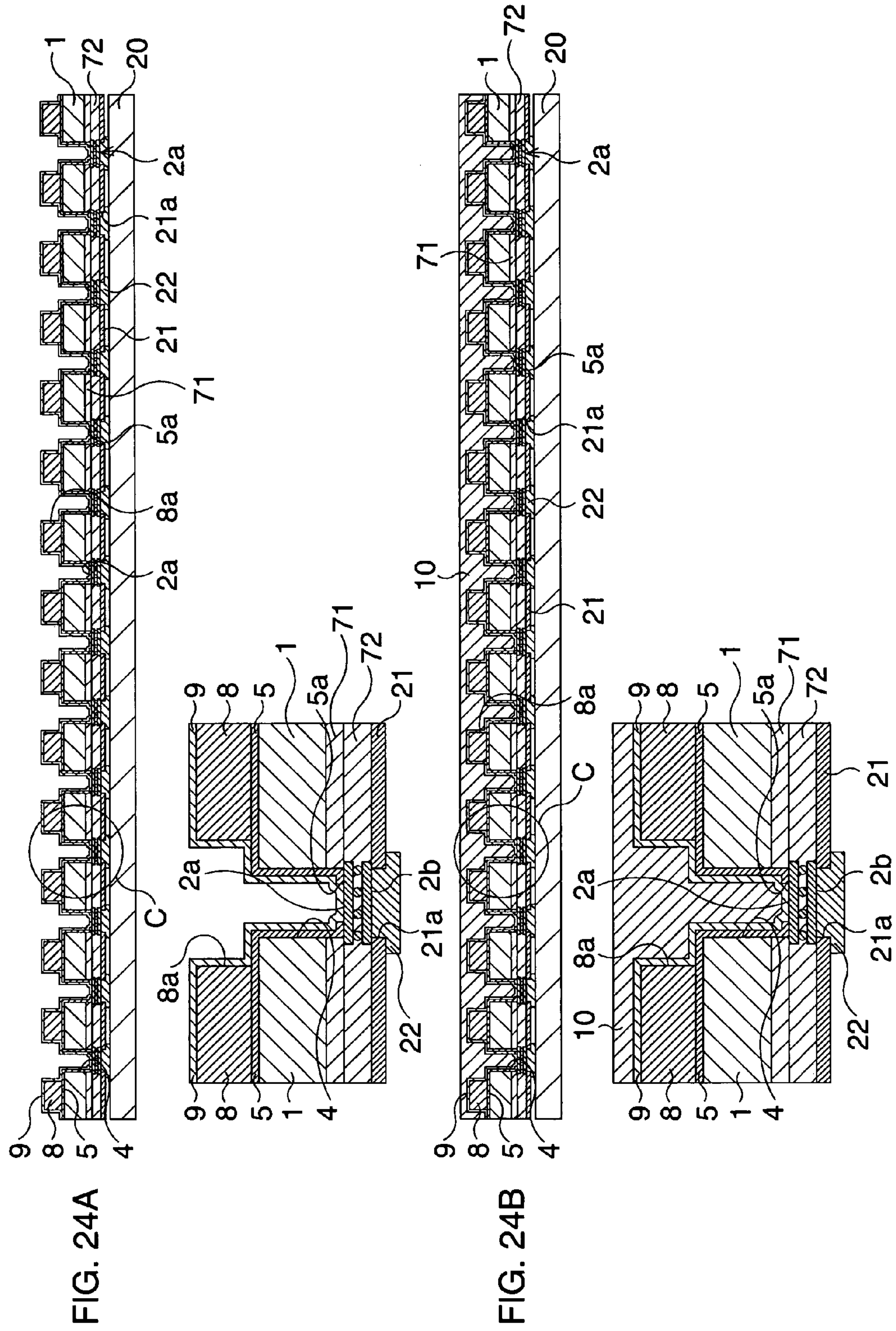
FIGS. 24A and 24B are schematic sectional views sequentially showing process steps of a method of fabricating a semiconductor device according to the third embodiment, as continued from FIG. 23B.
Figure 25:
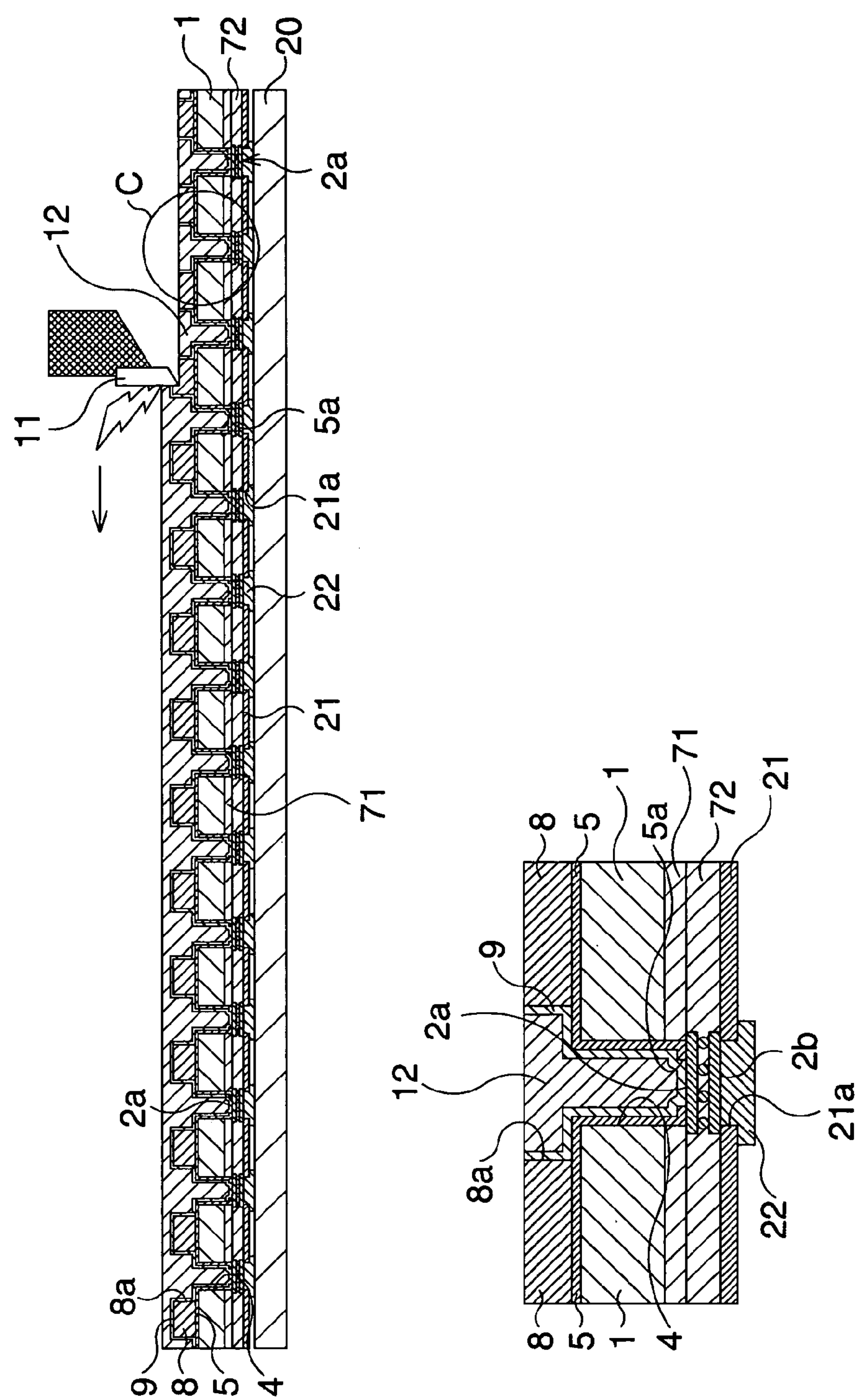
FIG. 25 is a schematic sectional view showing a process step of the method of fabricating a semiconductor device according to the third embodiment, as continued from FIG. 24B.
Figures 26A, 26B:
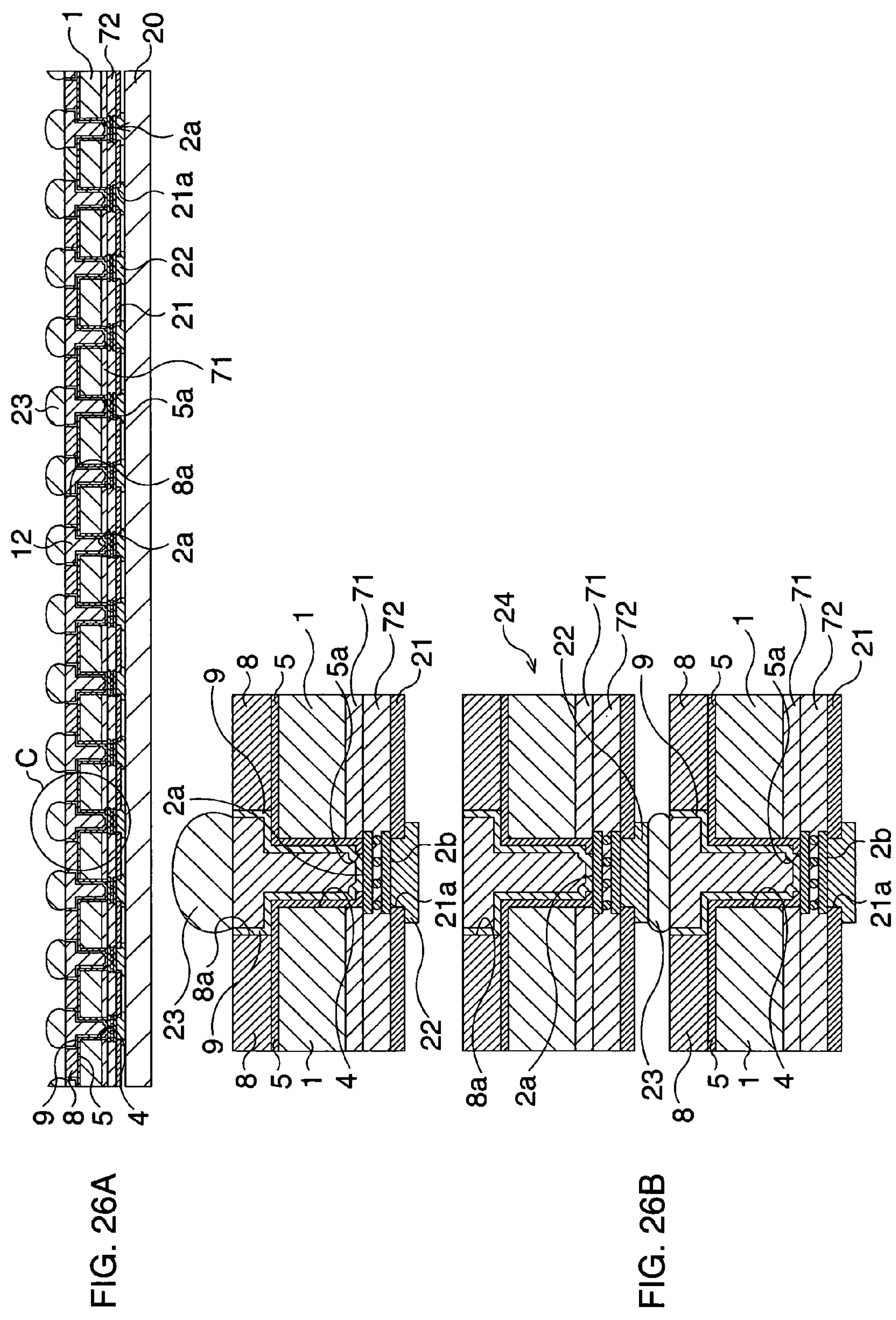
FIGS. 26A and 26B are schematic sectional views showing process steps of the method of fabricating a semiconductor device according to the third embodiment, as continued from FIG. 25B.

FIGS. 20A to 26B are schematic sectional views sequentially showing process steps of a method of fabricating a composite semiconductor device according to the third embodiment. It is to be noted that, in the individual drawings from FIGS. 20C, 20D, and 22A to 25, a portion surrounded by a circle C in the upper illustration (corresponded to the circumferential area of one terminal portion 2*a*) is given as an enlarged view in the lower illustration. In FIG. 26B, only schematic sectional views corresponded to the foregoing enlarged views are shown. Any components commonly appear also in the first embodiment will be given with the same reference numeral.

Figure 20A:
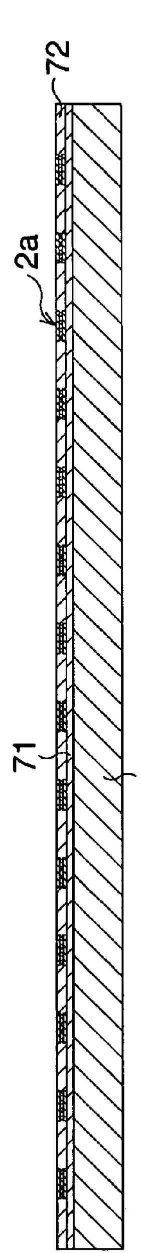
FIGS. 20A to 20D are schematic sectional views sequentially showing process steps of a method of fabricating a semiconductor device according to a third embodiment.

First as shown in FIG. 20A, a silicon semiconductor substrate 1 is obtained. An impurity-diffused region 71 in which impurity-diffused layers of the individual semiconductor elements are formed is formed in the surficial portion of the substrate, and further thereon, the terminal portions 2*a* are formed as being buried in an insulating film 72 typically composed of an inorganic material, while exposing their top surfaces. In this illustrated example, an area which falls between every adjacent terminal portions 2*a* serves as the element-forming area 103. The element-forming area 103 is an area in which LSI elements, typified by semiconductor elements such as MOS transistor, and passive elements such as capacitor and inductor, are formed. The LSI elements have the terminal portions 2*a*, and each terminal portion 2*a* comprises two patterned conductors connected through a viahole. The element-forming area 103 in this case can thus be referred to as an entire area not occupied by the terminal portions 2*a*.

Figure 20B:
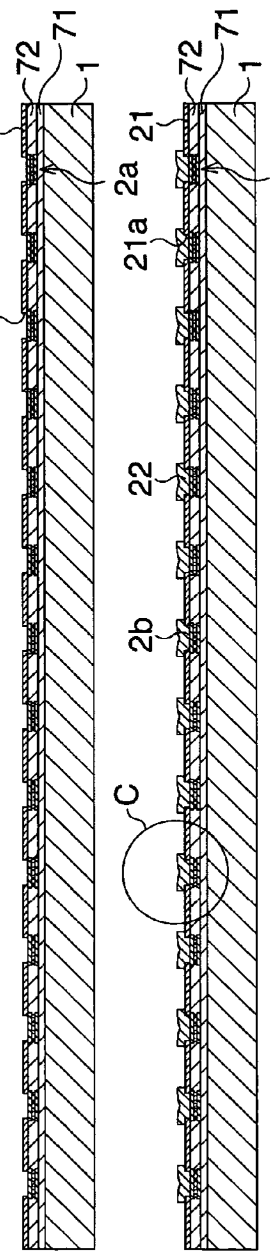

Next, as shown in FIG. 20B, an insulating film 21, which is typically composed of $SiO_2$ or SiN, is formed on the surface of the silicon semiconductor substrate 1 typically by the CVD process, and the insulating film 21 is then patterned by photolithography and-succeeding dry etching, to thereby form openings 21*a* in which a part of the surface contact portions 2*b* of the terminal portions 2 are exposed.

Figure 20C:
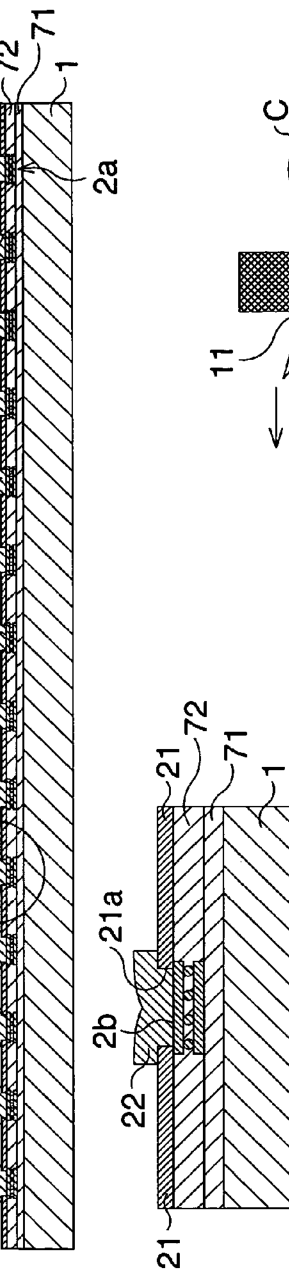

Next, as shown in FIG. 20C, a metal film composed of Au, Cu, Ag, Ni, Sn or any alloy of these metals based on an arbitrary alloy composition is formed on the insulating film 21 by the CVD process or sputtering process, and is then patterned to thereby form a protruded electrode 22 which is connected to the surface connection portion 2*b* of the terminal portion 2*a* through the opening 21*a*.

Figure 20D:
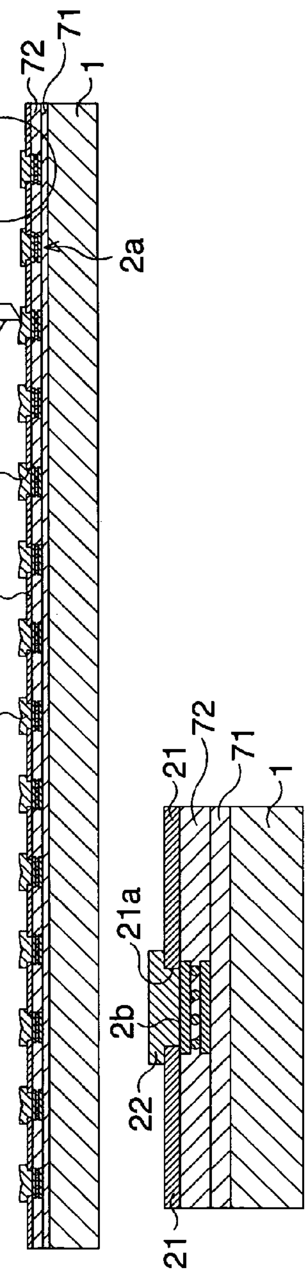

Next, as shown in FIG. 20D, the surface of the silicon semiconductor substrate 1 is subjected to cutting process using a hard bite 11 typically composed of diamond, to thereby remove the surficial portions of the individual protruded electrodes 22. By these procedures, the individual protruded electrodes 22 are successfully planarized and mirror-finished on their surfaces, exactly leveled in height, and freed from variation in height.

Figure 21A:
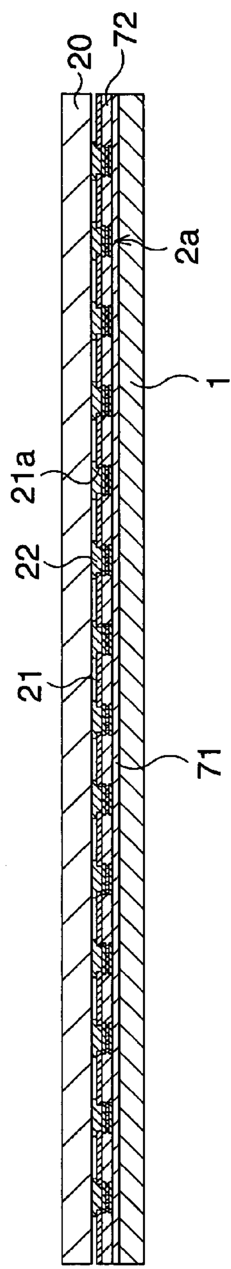
FIGS. 21A to 21C are schematic sectional views sequentially showing process steps of the method of fabricating a semiconductor device according to the third embodiment, as continued from FIG. 20D.
Figure 21B:
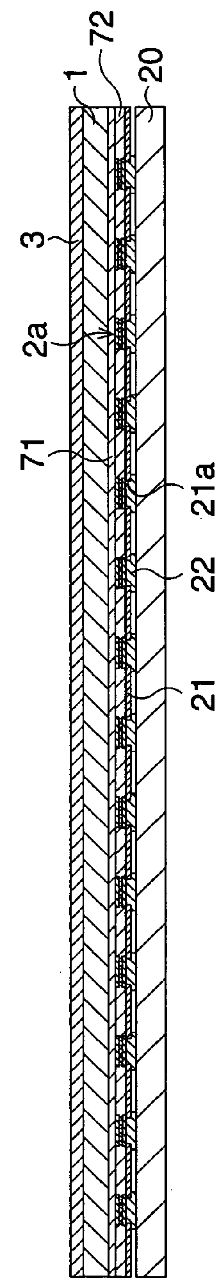

Next, as shown in FIG. 21B, the surface of the silicon semiconductor substrate 1 having the protruded electrodes 22 formed thereon is attached to a quartz or glass base 20 using a UV tape or the like, and the silicon semiconductor substrate 1 is then thinned to as thin as approximately 50 μm to 200 μm by grinding or etching the back surface of the silicon semiconductor substrate 1. For the case where the initial thickness of the silicon semiconductor substrate 1 is not uniform, or the non-uniformity is further accompanied by some waviness, it is preferable to obtain a substrate support (not shown) having a flat supporting surface, onto which the silicon semiconductor substrate 1 is fixed by adsorption, and more specifically by allowing the surface of the silicon semiconductor substrate 1 to be adsorbed by vacuum adsorption, for example. By this procedure, the surface of the silicon semiconductor substrate 1 is forcedly flattened by the adsorption onto the supporting surface, and the flattened surface gives a reference plane for planarization of the back surface. As described in the above, thickness of the silicon semiconductor substrate 1 can be adjusted also by mechanically grinding the back surface while assuming the surface of the substrate as a reference plane for the planarization of the back surface, to thereby remove any convex portions on the back surface by grinding, and to accomplish planarization and thickness adjustment.

Next, as shown in FIG. 21B, the photoresist 3 is coated on the back surface of the silicon semiconductor substrate 1.

Figure 21C:
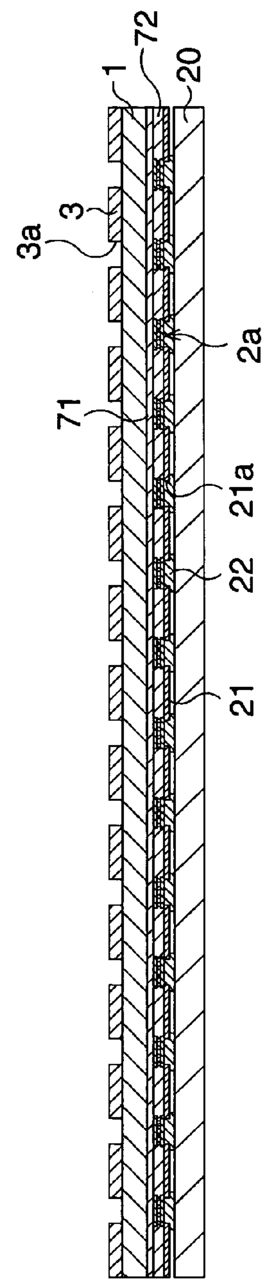

Next, as shown in FIG. 21C, the photoresist 3 is processed by photolithography to thereby form the openings 3*a* at projected sites of the individual terminal portions 2*a*.

Figure 22A:
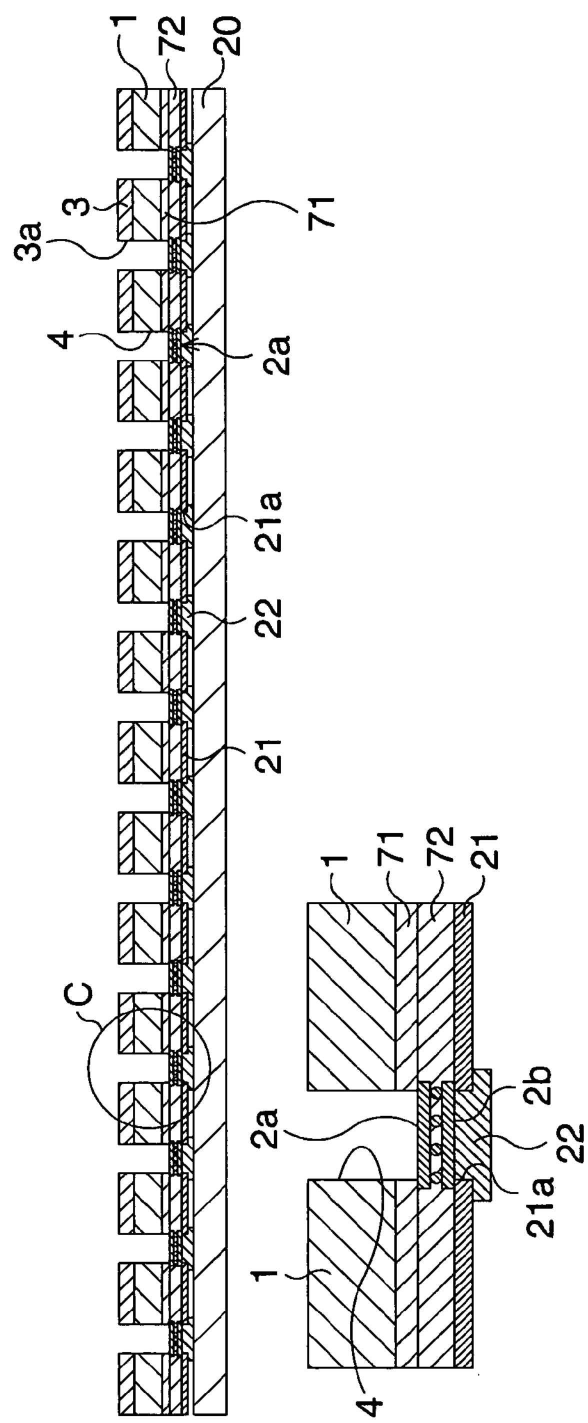
FIGS. 22A and 22B are schematic sectional views sequentially showing process steps of a method of fabricating a semiconductor device according to the third embodiment, as continued from FIG. 21C.

Next, as shown in FIG. 22A, the silicon semiconductor substrate 1, under masking by the photoresist 3, is etched from the back surface, typically by dry etching using a fluorine-base or chlorine base gas, to thereby form the viaholes 4 in which a part of the individual terminal portions 2*a* is exposed.

Figure 22B:
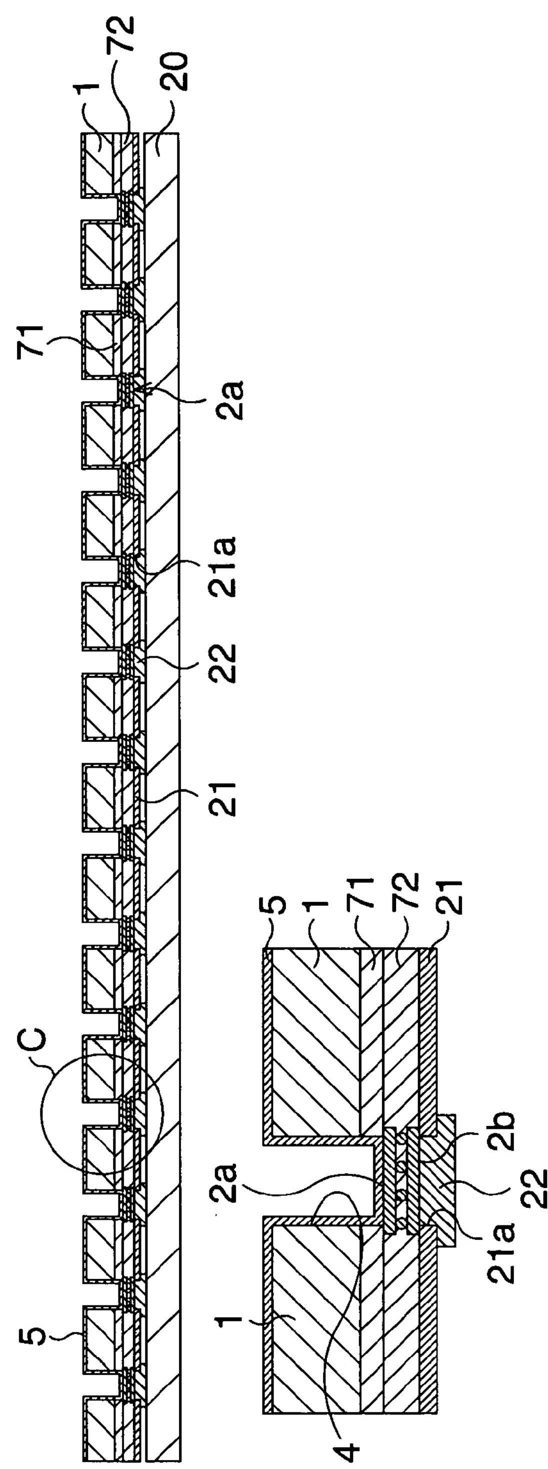

Next, the photoresist 3 is removed typically by ashing. More specifically, the ashing process herein is proceeded so that the photoresist 3 is immersed in an alkaline solution, and is then irradiated with an oxygen plasma to thereby remove the residue by ashing. Next, as shown in FIG. 22B, the insulating film 5, which is typically composed of $SiO_2$ or SiN, is formed to a thickness of 1 μm or around typically by the CVD process, on the back surface of the silicon semiconductor substrate 1 so as to cover the inner wall surface of the viaholes 4.

Figures 23A, 23B:
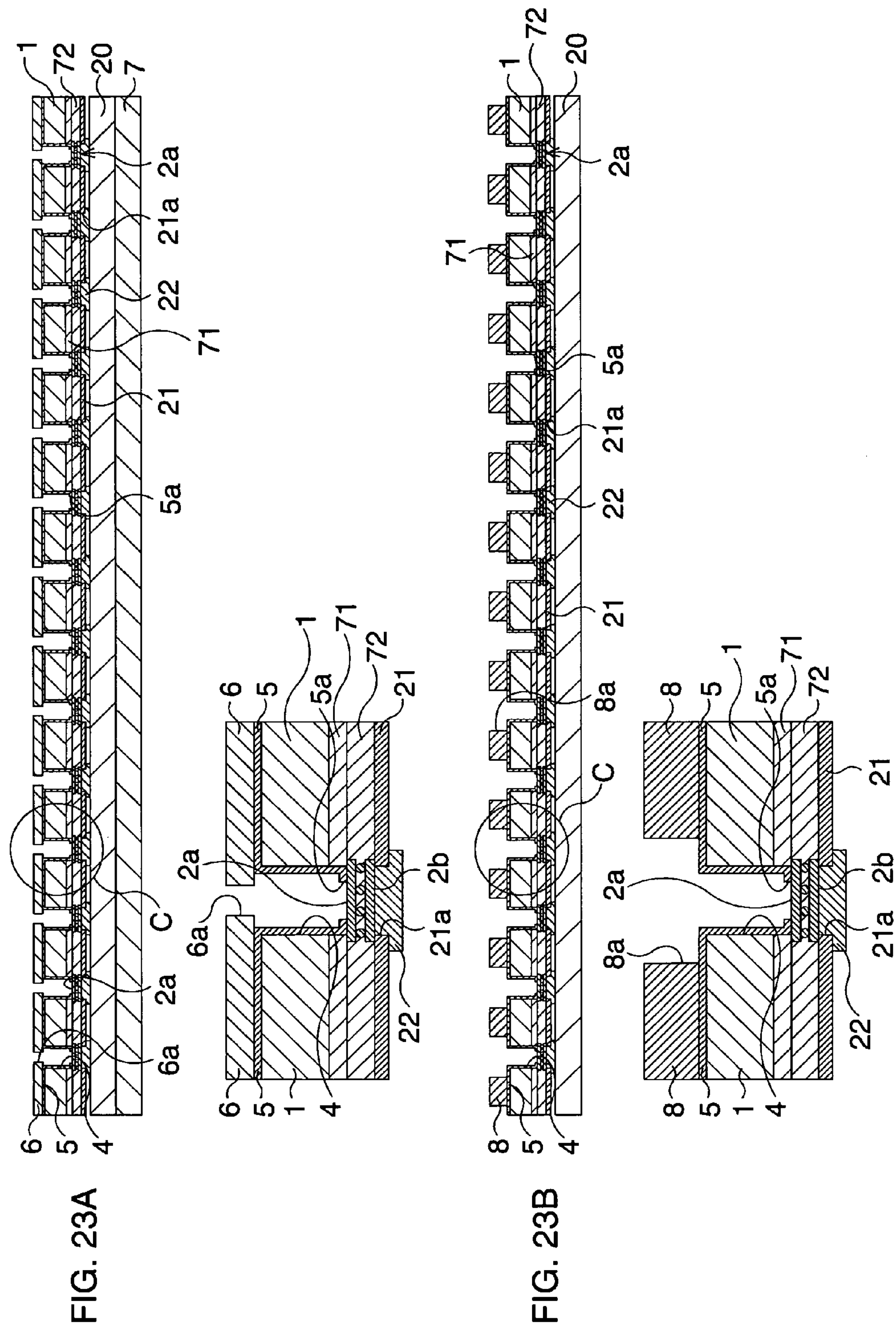
FIGS. 23A and 23B are schematic sectional views sequentially showing process steps of a method of fabricating a semiconductor device according to the third embodiment, as continued from FIG. 22B.

Next, as shown in FIG. 23A, a metal mask 6 is placed on the insulating film 5. The metal mask 6 has, formed therein, openings 6*a* having a diameter smaller than that of the viaholes 4, as being aligned with position of formation of the viaholes 4, and is stacked on the insulating film 5 based on alignment on the back surface of the silicon semiconductor substrate 1 so as to allow each opening 6*a* to fall within each viahole 4 (that is, the outer circumference of the opening 6*a* comes inside the outer circumference of the viahole 4). Position of the metal mask 6 is then fixed with the aid of magnetic force given by the magnet 7 disposed under the base 20.

The insulating film 5 is then dry-etched under masking by the metal mask 6. By the etching, the portion 5*a* of the insulating film 5 at the bottom of each viahole 4 and in a projected site of the opening 6*a* is removed, and thereby a part of the surface of the terminal portion 2*a* exposes.

The metal mask 6 is then removed, and as shown in FIG. 23B, a cuttable organic insulating material having a thickness larger than that of the insulating film 5, which is typically the insulating film 8 composed of polyimide, for example, and having a thickness of 30 μm or around, is placed. The insulating film 8 has formed therein the openings 8*a* having a diameter larger than that of the viahole 4 as being aligned with the viahole 4, and is placed on the insulating film 5 using a glue based on alignment on the back surface of the silicon semiconductor substrate 1 so as to allow each viahole 4 to fall within each opening 8*a*. Heat-resistant temperatures of the insulating film 8 and the glue are set higher than a maximum temperature possibly reached during the formation process of the through electrode described later.

Specific methods of placing the insulating film 8 include a method in which the insulating film 8 is sized corresponding to the individual LSI elements 31, and placed as being aligned with each predetermined LSI element 31, similarly to as described above in the first embodiment referring to FIG. 6; and a method in which the insulating film 8 is sized corresponding to a block 30 consisting of a plurality of the LSI elements 31, and is placed as being aligned with each block 30, similarly to as described above in the first embodiment referring to FIG. 7.

Next, as shown in FIG. 24A, a barrier metal layer 9 typically composed of TaN, TiN and the like is formed on the insulating film 8 by the CVD process or the sputtering process, so as to also cover the inner wall surface of the viaholes 4 and openings 8*a*, and a plating seed layer (not shown) composed of a conductive material, which is Cu herein, is formed by the CVD process or the sputtering process.

Next, as shown in FIG. 24B, a conductive material, which is Cu 10 herein, is deposited by plating on the barrier metal layer 9 and so as to fill the viaholes 4 and openings 8*a*. As the conductive material, it is also allowable to use, in place of Cu, any of Au, Ag, Ni and Sn, or any alloys of these metals with Cu having an arbitrary alloy composition.

The method of depositing the conductive material may be the vacuum evaporation process or the metal paste process, in place of plating. The metal paste process refers to a method of filling a metal paste into the openings 8*a* up (close) to the top surface of the insulating film 8 and allowing it to solidify.

Next, as shown in FIG. 25, the Cu 10 and the insulating film 8 are subjected to cutting process using a hard bite 11 typically composed of diamond, to thereby remove a portion of the Cu 10 placed on the insulating film 8 and the upper surficial portion of the insulating film 8. This is successful in planarizing the surface of the Cu 10 and the surface of the insulating film 8 while keeping a continuity of the both, in filling the viaholes 4 and openings 8*a* with Cu, and consequently in forming the through electrodes 12 having a leveled height. The through electrodes 12 are formed so as to penetrate the silicon semiconductor substrate 1 from the back surface thereof, and so as to electrically contact with the LSI elements through the terminal portions 2*a* at the bottom of the viaholes 4.

Next, as shown in FIG. 26A, a bump, which is a solder bump 23 herein, is formed on each through electrode 12.

After going through the processes similar to those shown in FIGS. 20A to 26A, the silicon semiconductor substrate 1 is diced for every LSI element to thereby cut out LSI chips 24, and each LSI chip 24 is then stacked on the silicon semiconductor substrate 1 processed similarly to as shown in FIGS. 20A to 26A. More specifically, the protruded electrode 22 of the LSI chip 24 is stacked on the solder bump 23, typically subjected to annealing, ultrasonic activation or plasma activation for thorough connection and integration. This makes a pair of terminal portions 2*a* connected with each other through the through electrode 12.

Although the above embodiment explained the case where the LSI elements 2 are stacked in two layers, the composite semiconductor device may also be fabricated by stacking three or more LSI elements 3.

As described in the above, the present embodiment makes it possible to form the through electrode 12 capable of ensuring a sufficient insulation from the substrate and mechanical strength in a simple and exact manner, to stack and integrate the chips in a simple and exact manner, to thereby realize a highly-reliable composite semiconductor device. Resistance of the through electrodes 12 against mechanical impact can further be improved and ensured by eliminating variation in height of the laterally-arranged individual through electrodes 12 in a simple manner to an advanced degree, and at the same time by planarizing the surface of the through electrodes 12 and the surface of the insulating film 8 burying these through electrodes 12 while keeping a continuity of the both.

Although the composite semiconductor device exemplified in the above embodiment was such as having a plurality of semiconductor wafers having the through electrode of the first embodiment, it is also allowable to configure the composite semiconductor device using a plurality of semiconductor devices having the through electrode of the second embodiment.

Figure 27:
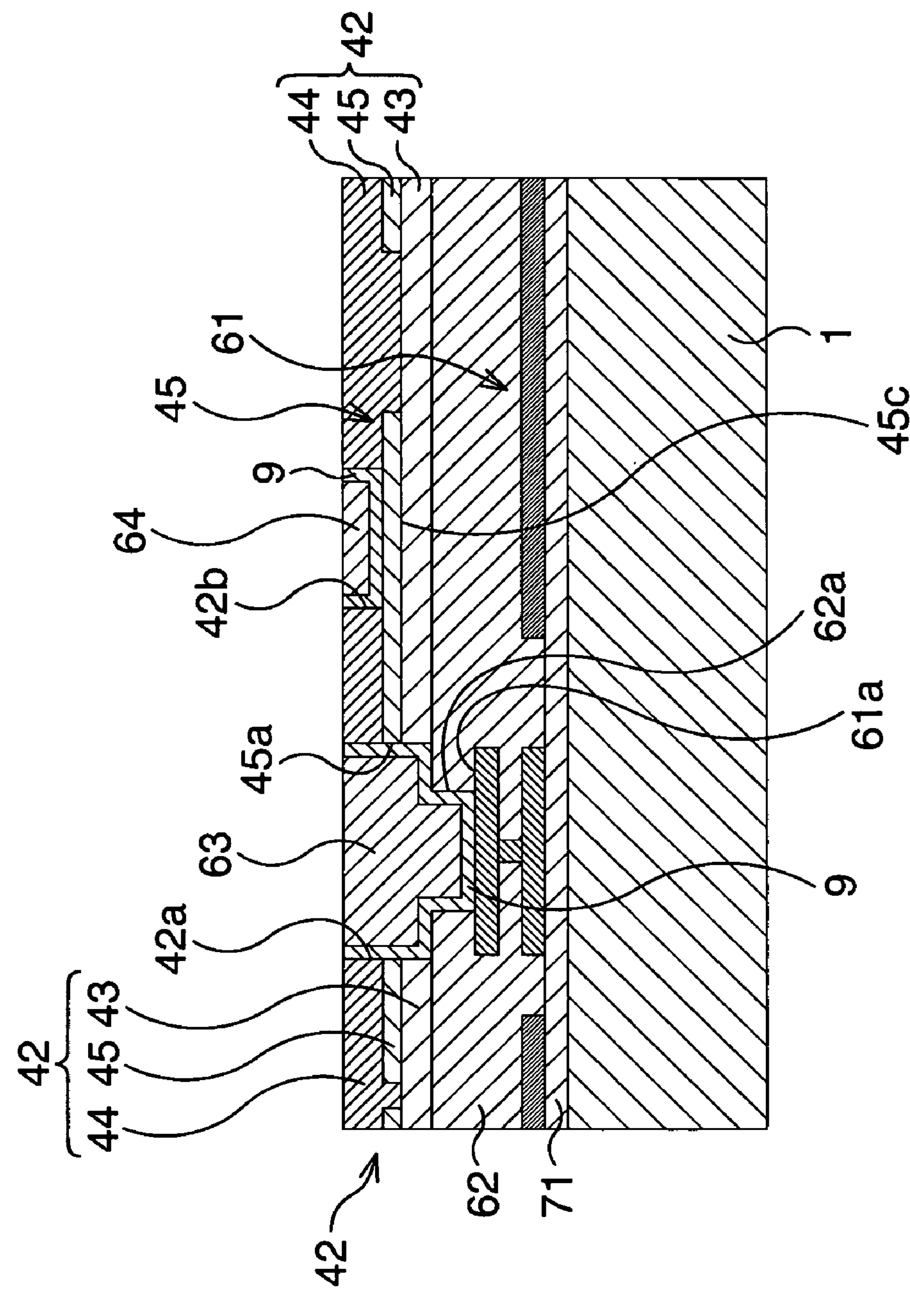
FIG. 27 is a schematic sectional view showing another example of a semiconductor device of the present invention.

Although the first to third embodiments showed the exemplary cases where the through electrode was formed on the back surface (second main surface) of the silicon semiconductor substrate, the present invention is also applicable to the case where the electrode is formed on the top surface (first main surface). This case applied to the semiconductor device of the second embodiment is shown in FIG. 27.

In this case, the impurity-diffused layer 71, and a thin-film electronic circuit 61 buried in an insulating film 62 are formed respectively in and on the silicon semiconductor substrate 1. Next, viaholes 62*a* in which a part of terminal portions 61a of the thin-film electronic circuit 61 are exposed are formed in the insulating film 62. Next, the insulating film 42 having, formed therein, the openings 42*a* having a diameter larger than that of the viaholes 62*a*, and the openings 42*b* in adjacent to the viaholes 62*a* is placed on the insulating film, while placing the adhesive layer 43 in between, so as to allow the viaholes 62*a* to fall within the openings 42*a*. In the insulating film 42, the contact portions 52*a* of the thin-film electronic circuits 45 are exposed on the side wall surface of the openings 42*a*, and the contact portions 45*c* of the thin-film electronic circuits 45 are exposed at the bottom of the openings 42*b*.

The barrier metal 9 is then formed, and a conductive material, which is the Cu 10 herein, is formed on the barrier metal 9 so as to fill the openings 42*a* and 42*b*. The Cu 10 and the insulating film 42 are subjected to cutting process using a hard bite 11 typically composed of diamond, to thereby remove a portion of the Cu 10 placed on the insulating film 42 and the upper surficial portion of the insulating resin layer 44 of the insulating film 42. This is successful in planarizing the surface of the Cu 10 and the surface of the insulating film 42 while keeping a continuity of the both, in filling the viaholes 62*a* and openings 42*a* with Cu to thereby form the electrodes 63 having a leveled height, and in filling the openings 42*b* with Cu to thereby form the electrodes 64 having a leveled height. The electrodes 63 are electrically connected with the thin-film electronic circuits 62 through the terminal portions 61*a* at the bottom of the viaholes 62*a*, and also with the thin-film electronic circuits 45 through the contact portions on the inner side wall surface of the openings 42*a*. On the other hand, the electrodes 64 are connected with the thin-film electronic circuits 45 through the contact portions 45*c* at the bottom of the openings 42*b*.

Figure 28A:
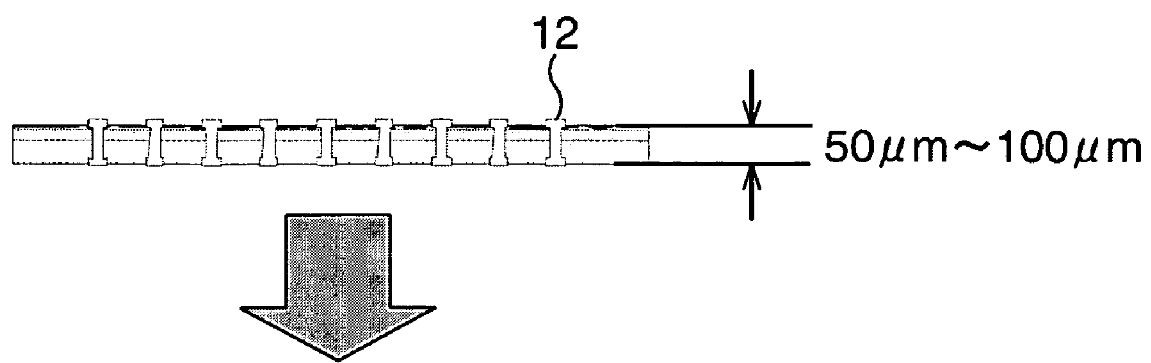
FIGS. 28A and 28B are schematic drawings of specific examples of a (composite) semiconductor device according to the first to third embodiment, applied to various devices.

The (composite) semiconductor devices of the first to third embodiments are applicable to a variety of devices. Specific examples of the applications are shown in FIG. 28.

Figure 28B:
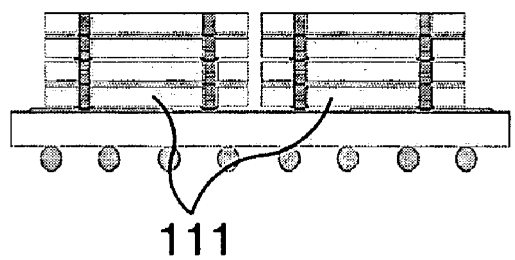

FIG. 28B shows an exemplary case of the composite semiconductor device of the present embodiment applied to a stacked flash memory 111, for the purpose of realizing a large storage capacity.

Application of the (composite) semiconductor device of the present embodiment to various devices successfully forms wirings in minimum length by virtue of the through electrode. This is successful in realizing further speedup and micronization of the semiconductor device.

The present invention can realize a highly-reliable semiconductor device having a through electrode capable of ensuring sufficient insulation from a substrate and mechanical strength; a method of fabricating a semiconductor device capable of forming the through electrode in a simple and exact manner; and a composite semiconductor device having a plurality of semiconductor devices stacked and integrated therein.

The present invention can also realize a highly-reliable semiconductor device having a first electronic circuit on a first main surface (top surface, or example) of a semiconductor wafer, and having a film having a second electronic circuit buried therein on a second main surface (back surface, for example), and capable of ensuring sufficient insulation from a substrate and mechanical strength; and a method of fabricating a semiconductor device capable of connecting the first and second electronic circuits by a simplified process, where a conventional process necessarily includes CMP of the back surface of the semiconductor substrate and photolithographic wiring formation process.

The present invention can still also realize a semiconductor device capable of ensuring an advanced reliability, in which stress possibly generated in the process of stacking and integrating the semiconductor devices having the through electrode is successfully reduced, by reducing variation in height of the laterally arranged individual through electrodes to a considerable degree, and at the same time by planarizing the surface of the through electrode and the surface of an insulating film burying the through electrode while keeping a continuity of the both.

What is claimed is:

1. A method of fabricating a semiconductor device having a semiconductor element formed on one main surface of a semiconductor substrate, comprising the steps of:

forming a first opening in said substrate from the opposite main surface thereof, so as to expose therein a contact portion of said semiconductor element;

forming a first insulating film on said opposite main surface of said semiconductor substrate so as to cover also the inner wall surface of said first opening;

removing a portion of said first insulating film locally at the bottom of said first opening so as to expose a part of said contact portion;

aligning and placing a film-formed second insulating film, having a second opening larger than said first opening, on said opposite main surface of said semiconductor substrate so as to allow said first opening to fall within said second opening;

forming a conductive film on said second insulating film so as to fill both of said first and second openings; and removing a part of said conductive film and said second insulating film to thereby form a through electrode which fills said first and second openings and is connected to said contact portion.

2. A method of fabricating a semiconductor device having a semiconductor element formed on one main surface of a semiconductor substrate, comprising the steps of:

forming a first opening in said substrate from the opposite main surface thereof, so as to expose therein a contact portion of said semiconductor element;

forming a first insulating film on said opposite main surface of said semiconductor substrate so as to cover also the inner wall surface of said first opening;

removing a portion of said first insulating film locally at the bottom of said first opening so as to expose a part of said contact portion;

aligning and placing a film-formed second insulating film, having a second opening larger than said first opening, on said opposite main surface of said semiconductor substrate so as to allow said first opening to fall within said second opening;

filling a conductive material at least into said first and second openings to thereby form a conductive film electrically connected to said contact portion; and removing a part of said conductive film and said second insulating film to thereby form a through electrode which is connected to said contact portion.

3. The method of fabricating a semiconductor device according to claim 1, wherein said through electrode is formed by cutting said conductive film and said second insulating film so as to planarize the surface of said conductive film and the surface of said second insulating film while keeping a continuity of the both.

4. A method of fabricating a semiconductor device having a first electronic circuit formed on one main surface of a semiconductor substrate, comprising the steps of:

forming a first opening in said substrate from the opposite main surface thereof, so as to expose therein a first contact portion of said first electronic circuit;

forming an insulating film on said opposite main surface of said semiconductor substrate so as to cover also the inner wall surface of said first opening;

removing a portion of said first insulating film locally at the bottom of said first opening so as to expose a part of said first contact portion;

aligning and placing a film, said film having a second opening larger than said first opening, having a second electronic circuit formed as being buried therein, and having a second contact portion of said second electronic circuit as being exposed to the inner wall surface of said second opening, on said opposite main surface of said semiconductor substrate so as to allow said first opening to fall within said second opening;

forming a conductive film on said film so as to fill both of said first and second openings; and removing a part of said conductive film and said film to thereby form a through electrode which fills said first and second openings and is connected to each of said first and second contact portions.

5. The method of fabricating a semiconductor device according to claim 1, wherein said one main surface is a top surface of said semiconductor substrate, and said opposite main surface is a back surface of said semiconductor substrate.

6. The method of fabricating a semiconductor device according to claim 1, wherein said conductive film is formed by allowing a metal to deposit by the plating process.

7. The method of fabricating a semiconductor device according to claim 1, wherein the conductive film is formed by allowing a metal to deposit by the vacuum evaporation process.

8. The method of fabricating a semiconductor device according to claim 1, wherein the conductive film is formed by filling a metal paste into said first and second openings, and then allowing said metal paste to solidify.

9. The method of fabricating a semiconductor device according to claim 1, further comprising, in advance to formation of said first opening, a step of forming on said semiconductor element a protruded electrode which protrudes out from said one main surface of said semiconductor substrate.

10. The method of fabricating a semiconductor device according to claim 9, wherein the top end of said protruded electrode is removed by cutting to thereby make the top surface of said protruded electrode have a flat mirror surface.

11. The method of fabricating a semiconductor device according to claim 1, further comprising a step of forming a solder bump on said through electrode.

12. The method of fabricating a semiconductor device according to claim 1, wherein said semiconductor element is provided in a plural number, said second insulating film is sized corresponding to each of said semiconductor elements, and is placed on each of said semiconductor elements.

13. The method of fabricating a semiconductor device according to claim 1, wherein said semiconductor element is provided in a plural number, second insulating film is sized corresponding to a block consisting of a plurality of said semiconductor elements, and is placed on each of said blocks.

14. A method of fabricating a semiconductor device having a first electronic circuit formed on one main surface of a semiconductor substrate, comprising the steps of:

forming a first opening in said substrate from the opposite main surface thereof, so as to expose therein a first contact portion of said first electronic circuit;

forming an insulating film on said opposite main surface of said semiconductor substrate so as to cover also the inner wall surface of said first opening;

removing a portion of said first insulating film locally at the bottom of said first opening so as to expose a part of said first contact portion;

aligning and placing a film, said film having a second opening larger than said first opening, having a second electronic circuit formed as being buried therein, and having a second contact portion of said second electronic circuit as being exposed to the inner wall surface of said second opening, on said opposite main surface of said semiconductor substrate so as to allow said first opening to fall within said second opening;

filling a conductive material at least into said first and second openings to thereby form a conductive film electrically connected to said first and second contact portions; and removing a part of said conductive film and said film to thereby form a through electrode which is connected to each of said first and second contact portions.

15. The method of fabricating a semiconductor device according to claim 14, wherein said film has a third opening in which a third contact portion of said second electronic circuit is exposed, in adjacent to said second opening; and said conductive film is formed so as to bury said third opening together with said first and second openings, to thereby form an electrode electrically connected to said third contact portion, together with said through electrode.

16. The method of fabricating a semiconductor device according to claim 14, wherein said second electronic circuit in said film is formed so as to have a multi-layered structure.

17. The method of fabricating a semiconductor device according to claim 14, wherein said second opening of said film has a tapered inner wall surface, the diameter of the second opening on the top surface of said film being larger than the diameter on the bottom surface to be placed on said semiconductor substrate.

18. The method of fabricating a semiconductor device according to claim 14, wherein said second contact portion of said second electronic circuit in said film is formed so as to expose its top surface and side face onto the inner surface wall of said second opening.

19. The method of fabricating a semiconductor device according to claim 14, wherein said second contact portion of said second electronic circuit in said film is formed so as to be protruded out from the inner surface wall of said second opening.

20. The method of fabricating a semiconductor device according to claim 14, wherein said second contact portion of said second electronic circuit in said film is formed so as to cover the inner surface wall of said second opening.

21. The method of fabricating a semiconductor device according to claim 14, wherein said through electrode is formed by cutting said conductive film and said film so as to planarize the surface of said conductive film and the surface of said film while keeping a continuity of the both.

22. The method of fabricating a semiconductor device according to claim 14, wherein said one main surface is a top surface of said semiconductor substrate, and said opposite main surface is a back surface of said semiconductor substrate.

23. A semiconductor device comprising:

a semiconductor substrate having a semiconductor element formed on one main surface thereof;

a first opening formed from the opposite surface of said semiconductor substrate, so as to expose therein a contact portion of said semiconductor element;

a first insulating film formed on said opposite surface of said semiconductor substrate so as to cover also the inner wall surface of said first opening, and so as to expose a part of said contact portion out from a part of the bottom of said first opening;

a film-formed second insulating film having a thickness larger than said first insulating film, having a second opening larger than said first opening, and coated on said opposite surface of said semiconductor substrate so as to allow said first opening to fall within said second opening; and a through electrode connected to said contact portion through filling of said first and second openings;

wherein the surface of said through electrode and the surface of said second insulating film are planarized while keeping a continuity of the both.

24. The semiconductor device according to claim 23, wherein said semiconductor element has, formed thereon, a protruded electrode which protrudes out from said one main surface of said semiconductor substrate.

25. A semiconductor device comprising:

a semiconductor substrate having a first electronic circuit formed on one main surface thereof;

a first opening formed from the opposite surface of said semiconductor substrate, so as to expose therein a first contact portion of said first electronic circuit;

an insulating film formed on said opposite surface of said semiconductor substrate so as to cover also the inner wall surface of said first opening, and so as to expose a part of said first contact portion out from a part of the bottom of said first opening;

a film having a second opening larger than said first opening, having a second electronic circuit formed as being buried therein, and having a second contact portion of said second electronic circuit as being exposed to the inner wall surface of said second opening, said film being placed on said opposite main surface of said semiconductor substrate so as to allow said first opening to fall within said second opening; and a through electrode connected to said first and second contact portions through filling of said first and second openings;

wherein the surface of said through electrode and the surface of said film are planarized while keeping a continuity of the both.

26. The semiconductor device according to claim 25, wherein said film has a third opening in which a third contact portion of said second electronic circuit is exposed, in adjacent to said second opening; and further includes an electrode electrically connected to said third contact portion through filling of said third opening;

wherein the surface of said through electrode, the surface of said electrode, and the surface of said film are planarized while keeping a continuity of these.

27. The semiconductor device according to claim 25, wherein said second opening of said film has a tapered inner wall surface, the diameter of the second opening on the top surface of said film being larger than the diameter on the bottom surface to be placed on said semiconductor substrate.

28. The semiconductor device according to claim 25, wherein said second contact portion of said second electronic circuit in said film is formed so as to expose its top surface and side face onto the inner surface wall of said second opening.

29. The semiconductor device according to claim 25, wherein said second contact portion of said second electronic circuit in said film is formed so as to be protruded out from the inner surface wall of said second opening.

30. The semiconductor device according to claim 25, wherein said second contact portion of said second electronic circuit in said film is formed so as to cover the inner surface wall of said second opening.

31. The semiconductor device according to claim 25, wherein the top end of said protruded electrode is made so as to have a flat mirror surface.

32. The semiconductor device according to claim 25, further comprising a bump formed on said through electrode.

33. A composite semiconductor device comprising at least two semiconductor devices;

each semiconductor device comprises:

a semiconductor substrate having a semiconductor element formed on one main surface thereof;

a first opening formed from the opposite surface of said semiconductor substrate, so as to expose therein a contact portion of said semiconductor element;

a first insulating film formed on said opposite surface of said semiconductor substrate so as to cover also the inner wall surface of said first opening, and so as to expose a part of said contact portion out from a part of the bottom of said first opening;

a film-formed second insulating film having a thickness larger than said first insulating film, having a second opening larger than said first opening, and coated on said opposite surface of said semiconductor substrate so as to allow said first opening to fall within said second opening; and a through electrode connected to said contact portion through filling of said first and second openings;

wherein the surface of said through electrode and the surface of said second insulating film are planarized while keeping a continuity of the both;

wherein, in every pair of semiconductor devices brought in focus, said through electrode of one semiconductor and a protruded electrode of the other semiconductor device are connected, stacked and integrated with each other.

34. The composite semiconductor device according to claim 33, wherein each of said semiconductor devices has a bump on said through electrode; and in every pair of semiconductor devices in focus, said bump of one semiconductor and a protruded electrode of the other semiconductor device are connected, stacked and integrated with each other.

35. A composite semiconductor device comprising at least two semiconductor devices;

each semiconductor device comprises:

a semiconductor substrate having a first electronic circuit formed on one main surface thereof;

a first opening formed from the opposite surface of said semiconductor substrate, so as to expose therein a first contact portion of said first electronic circuit;

an insulating film formed on said opposite surface of said semiconductor substrate so as to cover also the inner wall surface of said first opening, and so as to expose a part of said first contact portion out from a part of the bottom of said first opening;

a film having a second opening larger than said first opening, having a second electronic circuit formed as being buried therein, and having a second contact portion of said second electronic circuit as being exposed to the inner wall surface of said second opening, said film being placed on said opposite main surface of said semiconductor substrate so as to allow said first opening to fall within said second opening; and a through electrode connected to said first and second contact portions through filling of said first and second openings;

wherein the surface of said through electrode and the surface of said film are planarized while keeping a continuity of the both, wherein, in every pair of semiconductor devices brought in focus, said through electrode of one semiconductor and a protruded electrode of the other semiconductor device are connected, stacked and integrated with each other.

36. The composite semiconductor device according to claim 35, wherein each of said semiconductor devices has a bump on said through electrode; and in every pair of semiconductor devices in focus, said bump of one semiconductor and a protruded electrode of the other semiconductor device are connected, stacked and integrated with each other.

* * * * *